(12) United States Patent
Ouderkirk et al.

(10) Patent No.: US 11,435,501 B1
(45) Date of Patent: Sep. 6, 2022

(54) SYSTEM, APPARATUS AND METHOD FOR OPTICAL DEVICES WITH ANTIREFLECTIVE TREATMENTS

(71) Applicant: META PLATFORMS TECHNOLOGIES, LLC, Menlo Park, CA (US)

(72) Inventors: Andrew John Ouderkirk, Redmond, WA (US); Katherine Marie Smyth, Seattle, WA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 15 days.

(21) Appl. No.: 16/034,384

(22) Filed: Jul. 13, 2018

Related U.S. Application Data

(60) Provisional application No. 62/646,900, filed on Mar. 22, 2018.

(51) Int. Cl.
*G02B 1/111* (2015.01)
*G02B 27/01* (2006.01)
(Continued)

(52) U.S. Cl.
CPC .............. *G02B 1/111* (2013.01); *B05D 1/005* (2013.01); *B05D 3/12* (2013.01); *B05D 5/061* (2013.01);
(Continued)

(58) Field of Classification Search
CPC  G02B 1/111; G02B 26/0875; G02B 27/0172; G02B 2027/0178; G02B 1/11;
(Continued)

(56) References Cited

U.S. PATENT DOCUMENTS

| 60,109 A | 11/1866 | Woodward |
|---|---|---|
| 3,571,555 A | 3/1971 | Townes et al. |

(Continued)

FOREIGN PATENT DOCUMENTS

| KR | 10-2011-0107812 A | 10/2011 |
|---|---|---|
| WO | 2008/156166 A1 | 12/2008 |

(Continued)

OTHER PUBLICATIONS

Notice of Allowance received for U.S. Appl. No. 15/972,794 dated Oct. 16, 2020, 22 pages.
(Continued)

*Primary Examiner* — Stephone B Allen
*Assistant Examiner* — Rahman Abdur
(74) *Attorney, Agent, or Firm* — FisherBroyles, LLP

(57) ABSTRACT

A method may include stretching a deformable bounding element into a stretched state. The method may further include coating the deformable bounding element with at least one layer of an anti-reflective material while the deformable bounding element is in the stretched state and assembling an optical lens assembly including the deformable bounding element, such that the optical lens assembly adjusts at least one optical property by controlling a shape of the deformable bounding element. The deformable bounding element may have less tension when in a neutral state than the deformable bounding element has when in the stretched state. The method may additionally include coating the deformable bounding element with at least one layer of an anti-reflective material while the deformable bounding element is not in a stretched state. Various other apparatuses, systems, and methods are also disclosed.

23 Claims, 16 Drawing Sheets

(51) Int. Cl.
    *G02B 26/08*      (2006.01)
    *B05D 3/12*      (2006.01)
    *B05D 5/06*      (2006.01)
    *B05D 1/00*      (2006.01)

(52) U.S. Cl.
    CPC ..... *G02B 26/0875* (2013.01); *G02B 27/0172* (2013.01); *G02B 2027/0178* (2013.01)

(58) Field of Classification Search
    CPC .... G02B 5/3008; G02B 5/3083; G02B 1/118; G02B 5/128; G02B 5/0841; G02B 26/001; G02B 1/115; G02B 26/08; G02B 27/0176; B05D 3/12; B05D 5/061; B05D 1/005; B29D 11/0073; C09B 57/00
    USPC ................................................. 359/484.03
    See application file for complete search history.

(56) References Cited

U.S. PATENT DOCUMENTS

| | | |
|---|---|---|
| 3,797,922 A | 3/1974 | Plummer |
| 4,477,158 A | 10/1984 | Pollock et al. |
| 5,154,862 A | 10/1992 | Reagan et al. |
| 5,225,244 A | 7/1993 | Aharoni et al. |
| 5,663,779 A | 9/1997 | Karasawa |
| 5,956,183 A | 9/1999 | Epstein et al. |
| 6,081,388 A | 6/2000 | Widl |
| 6,420,441 B1 | 7/2002 | Allen et al. |
| 7,008,054 B1 | 3/2006 | Kurtin et al. |
| 7,118,219 B2 | 10/2006 | Itagaki |
| 7,125,508 B2 * | 10/2006 | Ide ................ B32B 37/153 264/250 |
| 7,864,440 B2 | 1/2011 | Berge |
| 7,866,816 B2 | 1/2011 | Kurtin |
| 8,210,678 B1 | 7/2012 | Farwig |
| 8,441,737 B2 | 5/2013 | Buch et al. |
| 10,409,089 B2 | 9/2019 | Pugh et al. |
| 10,698,224 B1 | 6/2020 | Cooke et al. |
| 10,754,145 B1 | 8/2020 | Ouderkirk et al. |
| 10,881,287 B1 | 1/2021 | Ouderkirk et al. |
| 10,928,558 B1 | 2/2021 | Cooke et al. |
| 10,928,656 B1 | 2/2021 | Smyth et al. |
| 10,962,791 B1 | 3/2021 | Ouderkirk et al. |
| 11,011,739 B1 | 5/2021 | Ouderkirk et al. |
| 11,048,075 B1 | 6/2021 | Ouderkirk et al. |
| 2003/0003295 A1 | 1/2003 | Dreher et al. |
| 2003/0054115 A1 | 3/2003 | Albano et al. |
| 2003/0067245 A1 | 4/2003 | Pelrine et al. |
| 2003/0083433 A1 | 5/2003 | James et al. |
| 2006/0024976 A1 | 2/2006 | Waldfried et al. |
| 2006/0073424 A1 | 4/2006 | Koveshnikov et al. |
| 2006/0228092 A1 * | 10/2006 | Hebrink ............ G02B 5/0268 385/147 |
| 2007/0035839 A1 * | 2/2007 | Ibuki .................. G02B 1/111 359/582 |
| 2008/0038561 A1 * | 2/2008 | Yoshizawa .......... C09D 133/16 428/411.1 |
| 2008/0049431 A1 * | 2/2008 | Boek ................. H01L 51/5281 362/311.06 |
| 2008/0088793 A1 | 4/2008 | Sverdrup et al. |
| 2008/0123049 A1 | 5/2008 | Volk |
| 2008/0144185 A1 | 6/2008 | Wang et al. |
| 2008/0170299 A1 | 7/2008 | Kawabata |
| 2008/0171431 A1 | 7/2008 | Yu et al. |
| 2008/0290435 A1 | 11/2008 | Oliver et al. |
| 2008/0291394 A1 | 11/2008 | Ishak |
| 2009/0015786 A1 | 1/2009 | Harris |
| 2009/0027778 A1 | 1/2009 | Wu et al. |
| 2009/0096106 A1 | 4/2009 | Vrtis et al. |
| 2009/0289529 A1 | 11/2009 | Ito et al. |
| 2009/0304924 A1 | 12/2009 | Gadgil |
| 2010/0075056 A1 | 3/2010 | Axisa et al. |
| 2010/0109486 A1 | 5/2010 | Polyakov et al. |
| 2010/0168409 A1 * | 7/2010 | Fujita ................ B29C 48/21 536/58 |
| 2010/0202054 A1 | 8/2010 | Niederer |
| 2010/0238400 A1 | 9/2010 | Volk |
| 2011/0075096 A1 | 3/2011 | Ishak et al. |
| 2011/0085131 A1 | 4/2011 | Gupta et al. |
| 2011/0176105 A1 | 7/2011 | Harris |
| 2011/0179861 A1 | 7/2011 | Grange et al. |
| 2011/0235326 A1 | 9/2011 | Yeh et al. |
| 2011/0294305 A1 * | 12/2011 | Jacobs ............... G02B 26/0841 438/763 |
| 2012/0029416 A1 | 2/2012 | Parker et al. |
| 2012/0032559 A1 | 2/2012 | Hino et al. |
| 2012/0041553 A1 | 2/2012 | Gupta et al. |
| 2012/0044571 A1 | 2/2012 | Mukawa |
| 2012/0063000 A1 | 3/2012 | Batchko et al. |
| 2012/0087015 A1 | 4/2012 | Nibauer et al. |
| 2012/0092775 A1 | 4/2012 | Duston et al. |
| 2012/0170920 A1 | 7/2012 | Moreau et al. |
| 2012/0229754 A1 | 9/2012 | Iyer et al. |
| 2012/0250151 A1 | 10/2012 | Lee et al. |
| 2012/0287512 A1 * | 11/2012 | Egan ................ G02C 11/10 359/666 |
| 2013/0171546 A1 | 7/2013 | White et al. |
| 2013/0176628 A1 | 7/2013 | Batchko et al. |
| 2013/0300635 A1 | 11/2013 | White et al. |
| 2014/0009039 A1 | 1/2014 | Jenninger et al. |
| 2014/0078586 A1 * | 3/2014 | Spurgeon ............ G02B 5/124 359/530 |
| 2014/0153102 A1 | 6/2014 | Chang |
| 2014/0186215 A1 | 7/2014 | Shinta et al. |
| 2014/0227548 A1 | 8/2014 | Myrick |
| 2014/0300857 A1 | 10/2014 | Cohen-Tannoudji et al. |
| 2014/0312737 A1 | 10/2014 | Jenninger et al. |
| 2015/0062719 A1 | 3/2015 | Kyung et al. |
| 2015/0116656 A1 | 4/2015 | Stevens et al. |
| 2015/0138110 A1 * | 5/2015 | Yairi ................ G06F 1/1632 345/173 |
| 2015/0146161 A1 | 5/2015 | Rigato et al. |
| 2015/0302990 A1 | 10/2015 | Ghosh et al. |
| 2015/0323812 A1 | 11/2015 | Ishak et al. |
| 2016/0004099 A1 | 1/2016 | Steven et al. |
| 2016/0091635 A1 * | 3/2016 | Ibuki ................ G02B 1/118 15/209.1 |
| 2016/0187985 A1 | 6/2016 | Lim et al. |
| 2017/0021385 A1 | 1/2017 | Smith et al. |
| 2017/0045649 A1 | 2/2017 | Bolis |
| 2017/0160600 A1 | 6/2017 | Galstian et al. |
| 2017/0177106 A1 | 6/2017 | Kihara |
| 2017/0184848 A1 | 6/2017 | Vallius |
| 2017/0188021 A1 | 6/2017 | Lo et al. |
| 2017/0192595 A1 | 7/2017 | Choi et al. |
| 2017/0261653 A1 | 9/2017 | Peyman |
| 2017/0299956 A1 | 10/2017 | Holland et al. |
| 2017/0317269 A1 | 11/2017 | Zhang et al. |
| 2017/0336641 A1 | 11/2017 | Von Und Zu Liechtenstein |
| 2018/0255250 A1 | 9/2018 | Price et al. |
| 2018/0275394 A1 | 9/2018 | Yeoh et al. |
| 2018/0335649 A1 | 11/2018 | Tsai |
| 2019/0173128 A1 | 6/2019 | Visco et al. |
| 2019/0243123 A1 | 8/2019 | Bohn |
| 2019/0296218 A1 | 9/2019 | Ouderkirk et al. |
| 2019/0302479 A1 | 10/2019 | Smyth et al. |
| 2020/0166742 A1 | 5/2020 | Peyman |

FOREIGN PATENT DOCUMENTS

| | | |
|---|---|---|
| WO | 2010/078666 A1 | 7/2010 |
| WO | 2010/104904 A2 | 9/2010 |
| WO | 2019/183431 A1 | 9/2019 |
| WO | 2019/190887 A1 | 10/2019 |

OTHER PUBLICATIONS

Notice of Allowance received for U.S. Appl. No. 15/992,731 dated Nov. 18, 2020, 37 pages.

Final Office Action received for U.S. Appl. No. 16/106,945 dated Nov. 24, 2020, 94 pages.

(56) References Cited

OTHER PUBLICATIONS

Final Office Action received for U.S. Appl. No. 16/018,752 dated Nov. 30, 2020, 41 pages.
Notice of Allowance received for U.S. Appl. No. 16/018,746 dated Nov. 3, 2020, 39 pages.
Notice of Allowance received for U.S. Appl. No. 16/021,580 dated Dec. 9, 2020, 68 pages.
Non-Final Office Action received for U.S. Appl. No. 16/016,428 dated Mar. 12, 2021, 56 pages.
Non-Final Office Action received for U.S. Appl. No. 16/013,837 dated Jan. 23, 2020, 22 pages.
Notice of Allowance received for U.S. Appl. No. 16/013,837 dated Apr. 14, 2020, 14 pages.
Preinterview First Office Action received for U.S. Appl. No. 15/992,731 dated Sep. 27, 2019, 17 pages.
Final Office Action received for U.S. Appl. No. 15/992,731 dated Jun. 2, 2020, 25 pages.
Non-Final Office Action received for U.S. Appl. No. 15/992,731 dated Aug. 24, 2020, 27 pages.
Examiner-Initiated Interview Summary received for U.S. Appl. No. 16/008,635 dated Apr. 20, 2020, 3 pages.
Notice of Allowance received for U.S. Appl. No. 16/008,635 dated May 4, 2020, 32 pages.
Non-Final Office Action received for U.S. Appl. No. 16/059,091 dated Apr. 8, 2020, 54 pages.
Final Office Action received for U.S. Appl. No. 16/059,091 dated Sep. 21, 2020, 18 pages.
Non-Final Office Action received for U.S. Appl. No. 16/106,945 dated Apr. 16, 2020, 59 pages.
Non-Final Office Action received for U.S. Appl. No. 16/041,634 dated Jul. 30, 2020, 24 pages.
Notice of Allowance received for U.S. Appl. No. 16/041,634 dated Aug. 28, 2020, 31 pages.
Preinterview First Office Action received for U.S. Appl. No. 16/018,752 dated Dec. 16, 2019, 19 pages.
Preinterview First Office Action received for U.S. Appl. No. 16/018,746 dated Jul. 14, 2020, 20 pages.
Notice of Allowance Action received for U.S. Appl. No. 16/018,746 dated Sep. 17, 2020, 24 pages.
Preinterview First Office Action received for U.S. Appl. No. 16/021,580 dated Aug. 4, 2020, 48 pages.
Press Kit Home, "Adaptive glasses", accessed at http://tvc.utah.edu, as accessed on Mar. 13, 2018, 5 pages.
Billah et al., "Microstructure Evolution and Electrical Characterization of Lanthanum doped Barium Titanate (BaTi03) Ceramics", International Conference on Mechanical Engineering, AIP Conf. Proc. 1754, accessed on Jul. 12, 2016, pp. 030006-1-030006-7.
Cao et al., Grain Size and Domain Size Relations in Bulk Ceramic Ferroelectric Materials, J. Phys. Chem Solids vol. 57, No. 10, pp. 1499-1505, 1996.
Ding et al., "Surface profiling of an aspherical liquid lens with a varied thickness membrane," Optics Express 3122-3132, vol. 25, No. 4 (Feb. 6, 2017).
He et al., Linear Electro-Optic Properties of Orthorhombic PZN-8%PT Single Crystal, IEEE Transactions on Ultrasonics, Ferroelectrics, and Frequency Control, vol. 58, No. 6 (Jun. 1, 2011).
Knapp et al., "Understanding Zirconia Crown Esthetics and Optical Properties" Inclusive magazine accessed at http://glidewelldental.com/education/inclusive-dental-implant-magazine-volume-2-issue-4/, as accessed on Jun. 12, 2018, vol. 2, Issue 4, 17 pages.
Optotune, "Focus tunable lenses", accessed at http://www.optotune.com/technology/focus-tunable-lenses, accessed on Mar. 13, 2018, 2 pages.
Polight, "How does it work", accessed at http://www.polight.com/technology-and-products/how-does-it-work/default.aspx, accessed on Mar. 13, 2018, 3 pages.
UZOOM Adlens, "Adjustable Lens Glasses: How They Work", accessed at https://adlens.com/how-it-works/, accessed on Mar. 28, 2018, 9 pages.
Piezo Technology, "Highly Reliable Multilayer Piezo Actuators", accessed on https://www.piceramic.com/en/piezo-technology/picma/, accessed on Mar. 14, 2018, 8 pages.
Piezo Technology, "Displacement Modes of Piezoelectric Actuators", accessed on https://www.piceramic.com/en/piezo-technology/properties-piezo-actuators/displacement-modes/, accessed on Mar. 14, 2018, 12 pages.
Jiang et al., "Transparent Electro-Optic Ceramics and Devices", Proceedings vol. 5644, Optoelectronic devices and integration, accessed at https://doi.org/10.1117/12.582105, Jan. 17, 2005, 15 Pages.
Keplinger et al., "Stretchable, Transparent, Ionic Conductors", Science Magazine, vol. 341, DOI:10.1126/science.1240228, Accessed on Aug. 30, 2013, pp. 984-987.
Kong et al., "Transparent Ceramic Materials", Transparent Ceramics, Topics in Mining, Metallurgy, and Materials Engineering, Ch. 2, DOI: 10.1007/978-3-319-18956-7_2, Springer international Publishing Switzerland 2015, pp. 29-91.
Patra et al., "Comparison on Optical Properties of Pure and Doped Lithium Tetraborate Single Crystals and Glasses", Solid State Physics: Proceedings of the 56th DAE Solid State Physics Symposium 2011, AIP Conf. Proc. 1447, Dec. 11, 2012, pp. 1335-1336.
Riegler et al., "Index Matching Silicone for High Brightness LED Packaging", IMAPS International Conference on Device Packaging Mar. 13-16, Scottsdale AZ., Accessed on Mar. 18, 2005, 17 Pages.
Shian et al., Tunable Lenses using Transparent Dielectric Elastomer Actuators, Optics Express, vol. 21, No. 7 (Apr. 2, 2013).
Hocking, L.M., "The effect of slip on the motion of a sphere close to a wall and of two adjacent spheres", Journal of Engineering Math., vol. 7 (1973), pp. 207-221.
Wang et al., "A Highly Stretchable, Transparent, and Conductive Polymer", Science Advances vol. 3, No. 3, e1602076, Mar. 10, 2017, pp. 1-10.
APC International, Lid., "Piezoelectric Materials, New Materials, Piezo theory", accessed at www.americanpiezo.com/knowledge-center/piezo-theory/new-materials/html, accessed on Mar. 15, 2018, 1 page.
Zhao et al., "Spherical aberration free liquid-filled tunable lens with variable thickness membrane," Optics Express vol. 23, No. 16, accessed at https://doi.org/10.1364/0.23.021264, accessed on Aug. 5, 2015, pp. 21264-21278.
Andrew J. Ouderkirk, et al.; Apparatuses, Systems, And Methods For Adjusting Fluid Lenses; U.S. Appl. No. 16/008,635, filed Jun. 14, 2018.
Katherine Marie Smyth, et al.; Optical Lens Assemblies, Head-Mounted Displays, and Related Methods; U.S. Appl. No. 16/021,650, filed Jun. 28, 2018.
Andrew John Ouderkirk, et al.; Multi-Element Prescription Lenses With Eye-Tracking; U.S. Appl. No. 16/041,634, filed Jul. 20, 2018.
Andrew John Ouderkirk, et al.; Electroactive Polymer Devices And Nanovoided Polymer Materials And Methods And Systems For Fabrication Thereof; U.S. Appl. No. 16/106,945, filed Aug. 21, 2018.
Andrew John Ouderkirk, et al.; Nanovoided Electroactive Polymer Devices, Systems, And Methods; U.S. Appl. No. 16/041,858, filed Jul. 23, 2018.
Andrew John Ouderkirk, et al.; Electroactive Polymer Devices, Systems, And Methods; U.S. Appl. No. 16/059,091, filed Aug. 9, 2018.
Andrew John Ouderkirk, et al.; Optical Devices, Systems, And Methods Of Manufacturing; U.S. Appl. No. 62/646,900, filed Mar. 22, 2018.
Andrew John Ouderkirk, et al.; Optical Devices, Systems, And Methods Of Manufacturing; U.S. Appl. No. 62/650,254, filed Mar. 29, 2018.
Katherine Marie Smyth, et al.; Optical Lens Assemblies And Related Methods; U.S. Appl. No. 16/018,746, filed Jun. 26, 2018.
Katherine Marie Smyth, et al.; Systems And Methods For Actuation Of Asymmetric Optical Elements; U.S. Appl. No. 15/992,731, filed May 30, 2018.
Andrew John Ouderkirk, et al.; Optical Lens Assemblies And Related Methods; U.S. Appl. No. 16/018,752, filed Jun. 26, 2018.

(56) References Cited

OTHER PUBLICATIONS

John M. Cooke, et al.; Optical Lens Assemblies, Head-Mounted Displays, And Methods Of Altering Optical Properties Of Optical Lens Assemblies; U.S. Appl. No. 16/013,837, filed Jun. 20, 2018.
Katherine Marie Smyth, et al.; Optical Lens Assemblies, Head-Mounted Displays, And Related Methods; U.S. Appl. No. 16/016,428, filed Jun. 22, 2018.
John M. Cooke, et al.; Optical Lens Assemblies, Head-Mounted Displays, And Related Methods; U.S. Appl. No. 16/021,580, filed Jun. 28, 2018.
Andrew John Ouderkirk, et al.; Electroactive Polymer Devices, Systems, And Methods; U.S. Appl. No. 16/035,562, filed Jul. 13, 2018.
"Adjustable Reading Glasses," URL: https://adlens.com/, retrieved on May 7, 2018, 1 page.
Guha et al., "Creating nanoscale emulsions using condensation", Nature Communications, vol. 8, No. 1371, Nov. 2017, pp. 1-7.
Merriam-Webster, "Porosity", URL: https://www.merriam-webster.com/dictionary/porosity, retrieved on Apr. 8, 2020, pp. 1-8.
International Search Report and Written Opinion received for PCT Application Serial No. PCT/US2019/023484 dated Jul. 3, 2019, 9 pages.
International Preliminary Report on Patentability received for PCT Application Serial No. PCT/US2019/023484 dated Oct. 1, 2020, 8 pages.
International Search Report and Written Opinion received for PCT Application Serial No. PCT/US2019/023485 dated Jul. 4, 2019, 11 pages.
International Preliminary Report on Patentability received for PCT Application Serial No. PCT/US2019/023485 dated Oct. 8, 2020, 8 pages.
Preinterview First Office Action received for U.S. Appl. No. 16/021,650 dated Feb. 1, 2021, 47 pages.
Gurvich, Mark R., "On Characterization of Anisotropic Elastomeric Materials for Structural Analysis", Rubber Chemistry and Technology, vol. 77, No. 1, 2004, pp. 115-130.
Non-Final Office Action received for U.S. Appl. No. 16/106,945 dated Mar. 30, 2021, 111 pages.
Notice of Allowance received for U.S. Appl. No. 16/018,752 dated Mar. 10, 2021, 32 pages.
Communication pursuant to Article 94(3) EPC received for EP Patent Application Serial No. 19715707.6 dated Mar. 22, 2021, 5 page.
Non-Final Office Action received for U.S. Appl. No. 16/035,562 dated Jun. 10, 2021, 36 pages.
Non-Final Office Action received for U.S. Appl. No. 16/016,428 dated Jun. 16, 2021, 43 pages.
U.S. Appl. No. 16/035,562, filed Jul. 13, 2018.
U.S. Appl. No. 15/972,794, filed May 7, 2018.
U.S. Appl. No. 16/059,091, filed Aug. 9, 2018.
U.S. Appl. No. 16/106,945, filed Aug. 21, 2018.

\* cited by examiner

SYSTEM, APPARATUS AND METHOD FOR OPTICAL DEVICES WITH ANTIREFLECTIVE TREATMENTS This application claims the benefit of U.S. Provisional Application No. 62/646,900, filed 22 Mar. 2018.

BACKGROUND

Putting on a virtual-reality or augmented-reality head-mounted system may be the beginning of a thrilling experience, one that may be more immersive than almost any other digital entertainment or simulation experience available today. Head-mounted systems may enable users to travel through space and time, interact with friends in a three-dimensional world, or play video games in a radically redefined way. Head-mounted systems may also be used for purposes other than recreation—governments may use them for military training simulations, doctors may use them to practice surgery, and engineers may use them as visualization aids.

In any use of a virtual-reality or augmented-reality system, making the experience as immersive as possible may be critical. However, many design features of head-mounted systems may potentially interfere with an immersive experience. For example, unwanted reflected light in the head-mounted system may degrade the quality of an image being displayed to a user. Due to light loss and reduced contrast, unwanted reflected light may present a particular problem in a head-mounted system in which displayed images and real images may be combined along the same imaging path. The quality of the displayed and real images may be degraded due to the effects of the unwanted reflected light. Furthermore, optical elements in head-mounted systems may change curvature during use. In augmented reality head-mounted systems, being able to see movement in the optical elements through reflected light may reduce acceptance of the head-mounted system by users.

SUMMARY

As will be described in greater detail below, the instant disclosure describes a system, apparatus and method for applying antireflective treatments to optical devices.

In one example, a method may include stretching a deformable bounding element into a stretched state. The method may further include coating the deformable bounding element with at least one layer of an anti-reflective material while the deformable bounding element is in the stretched state. The method may further include assembling an optical lens assembly comprising the deformable bounding element, such that the optical lens assembly adjusts at least one optical property by controlling a shape of the deformable bounding element and the deformable bounding element has less tension when in a neutral state than the deformable bounding element has when in the stretched state.

In some examples, the method may further include bonding at least one edge of the deformable bounding element to a support before stretching the deformable bounding element.

In some examples, coating the deformable bounding element with one or more layers of an anti-reflective material while the deformable bounding element is in the stretched state may further include fixing the support in a chamber, filling the chamber with a first monomer and a first monomer initiator, heating the first monomer and the first monomer initiator, thereby activating the first monomer initiator and polymerizing the first monomer into a first polymer. In some examples, the method may further include applying a layer of the first polymer to the deformable bounding element in the stretched state.

In some examples, coating the deformable bounding element with one or more layers of an anti-reflective material while the deformable bounding element is in the stretched state may further include removing the first monomer from the chamber, filling the chamber with a second monomer and a second monomer initiator, heating the second monomer and the second monomer initiator, thereby activating the second monomer initiator and polymerizing the second monomer into a second polymer. In some examples, the method may further include applying a layer of the second polymer to the deformable bounding element in the stretched state.

In some examples, coating the deformable bounding element with one or more layers of an anti-reflective material while the deformable bounding element is in the stretched state may further include fixing the support in a chamber, filling the chamber with a first monomer, applying activation energy to a first monomer initiator, thereby activating the first monomer initiator and polymerizing the first monomer into a first polymer. In some examples, the method may further include applying a layer of the first polymer to the deformable bounding element in the stretched state.

In some examples, the activation energy may be applied by at least one of a heat source, an x-ray source, an electron beam, an ultraviolet light source, or a visible light source.

In some examples, coating the deformable bounding element with one or more layers of an anti-reflective material while the deformable bounding element is in the stretched state may further include filling the chamber with a second monomer, applying the activation energy to a second monomer initiator, thereby activating the second monomer initiator and polymerizing the second monomer into a second polymer. In some examples, the method may further include applying a layer of the second polymer to the deformable bounding element in the stretched state.

In some examples, coating the deformable bounding element with one or more layers of an anti-reflective material while the deformable bounding element is in the stretched state may further include applying an anti-reflective material to the deformable bounding element in the stretched state, rotating the support, thereby applying a centrifugal force to the anti-reflective material and causing the anti-reflective material to spread over a surface of the deformable bounding element in the stretched state. In some examples, the anti-reflective material may include a polymer and a plurality of ceramic nanoparticles.

In some examples, the deformable bounding element may be stretched over the support by at least 10%.

In some examples, a refractive index of each layer of the one or more layers of anti-reflective material may differ from an adjacent layer of an anti-reflective material by at least 0.05.

In some examples, the one or more layers of anti-reflective material may withstand repeated cycles of deformation of up to 2% engineering strain without yield strain or yield failure.

In some examples, an average reflectivity of the one or more layers of anti-reflective material for frequencies of light between 400 nanometers and 650 nanometers which enters a surface of the one or more layers of anti-reflective material at an angle of incidence normal to a major plane of the surface of the one or more layers of anti-reflective material may be less than 2%.

In some examples, the one or more layers of anti-reflective material may have an elastic modulus of less than 50 gigapascals (GPa).

In some examples, the one or more layers of anti-reflective material may be non-porous.

In some examples, the one or more layers of anti-reflective material may have a reflection haze of less than 1% for 550 nanometer collimated light outside a 2-degree cone, and a longitudinal axis of the 2-degree cone may be normal to a major plane of a surface of the one or more layers of anti-reflective material.

In one example, an apparatus may include an optical lens assembly. In some examples, the optical lens assembly may include a deformable bounding element bonded to a structural support element and at least one layer of an anti-reflective material applied to a surface of the deformable bounding element.

In some examples, the one or more layers of anti-reflective material may be applied to the surface of the deformable bounding element while the deformable bounding element is stretched.

In some examples, the one or more layers of anti-reflective material may withstand repeated cycles of deformation of up to 2% engineering strain without yield strain or yield failure.

In one example, a system may include a head-mounted device. In some examples, the head-mounted device may include a pair of optical lens assemblies. In some examples, each of the pair of optical lens assemblies may include a deformable bounding element bonded to a structural support element and at least one layer of an anti-reflective material applied to a surface of the deformable bounding element.

In some examples, the one or more layers of anti-reflective material may withstand repeated cycles of deformation of up to 2% engineering strain without yield strain or yield failure and a refractive index of each layer of the least one or more layers of an anti-reflective material may differ from an adjacent layer of an anti-reflective material by at least 0.05.

In one example, a method may include coating a deformable bounding element with at least one layer of an anti-reflective material. In some examples, the one or more layers of anti-reflective material may have an elastic modulus of less than about 50 GPa. In some examples, an optical lens assembly may include the deformable bounding element, such that the optical lens assembly adjusts at least one optical property by controlling a shape of the deformable bounding element. In some examples, the one or more layers of anti-reflective material may withstand repeated cycles of deformation without yield strain or yield failure.

In some examples, coating the deformable bounding element with the one or more layers of anti-reflective material may include fixing the deformable bounding element to a support in a chamber, filling the chamber with a first monomer and a first monomer initiator, heating the first monomer and the first monomer initiator, thereby activating the first monomer initiator and polymerizing the first monomer into a first polymer. In some examples, the method may further include applying a layer of the first polymer to the deformable bounding element.

In some examples, coating the deformable bounding element with the one or more layers of anti-reflective material may further include removing the first monomer from the chamber, filling the chamber with a second monomer and a second monomer initiator, heating the second monomer and the second monomer initiator, thereby activating the second monomer initiator and polymerizing the second monomer into a second polymer. In some examples, the method may further include applying a layer of the second polymer to the deformable bounding element.

In some examples, coating the deformable bounding element with the one or more layers of anti-reflective material may include fixing the deformable bounding element to a support in a chamber, filling the chamber with a first monomer, applying activation energy to a first monomer initiator, thereby activating the first monomer initiator and polymerizing the first monomer into a first polymer. In some examples, the method may further include applying a layer of the first polymer to the deformable bounding element.

In some examples, applying the activation energy may include applying the activation energy by at least one of a heat source, an x-ray source, an electron beam, an ultraviolet light source, or a visible light source.

In some examples, coating the deformable bounding element with the one or more layers of anti-reflective material may further include filling the chamber with a second monomer, applying the activation energy to a second monomer initiator, thereby activating the second monomer initiator and polymerizing the second monomer into a second polymer. In some examples, the method may further include applying a layer of the second polymer to the deformable bounding element.

In some examples, coating the deformable bounding element with the one or more layers of anti-reflective material may include fixing the deformable bounding element to a support in a chamber, applying an anti-reflective material to the deformable bounding element, and rotating the support, thereby applying a centrifugal force to the anti-reflective material and causing the anti-reflective material to spread over a surface of the deformable bounding element. In some examples, the anti-reflective material may include a polymer and a plurality of ceramic nanoparticles.

In some examples, a refractive index of each layer of the one or more layers of anti-reflective material may differ from a refractive index of an adjacent layer of an anti-reflective material by at least 0.05.

In some examples, the one or more layers of anti-reflective material may withstand repeated cycles of deformation of up to 12% engineering strain without yield strain or yield failure.

In some examples, an average reflectivity of the one or more layers of anti-reflective material for frequencies of light between 400 nanometers and 650 nanometers which enters a surface of the one or more layers of anti-reflective material at an angle of incidence normal to a major plane of the surface of the one or more layers of anti-reflective material may be less than 2%.

In some examples, the deformable bounding element may have an elastic modulus of less than 1 GPa.

In some examples, the one or more layers of anti-reflective material may be non-porous.

In some examples, the one or more layers of anti-reflective material may have a reflection haze of less than 1% for 550 nanometer collimated light outside a 2-degree cone, and a longitudinal axis of the 2-degree cone may be normal to a major plane of a surface of the one or more layers of anti-reflective material.

In some examples, the method may further include feeding the deformable bounding element from a first roller before coating the deformable bounding element, and feeding the deformable bounding element onto a second roller after coating the deformable bounding element.

In one example, an apparatus may include an optical lens assembly. In some examples, the optical lens assembly may include a deformable bounding element bonded to a structural support element, and at least one layer of an anti-reflective material applied to a surface of the deformable bounding element. In some examples, the one or more layers of anti-reflective material may have an elastic modulus of less than 50 GPa.

In some examples, a refractive index of each layer of the one or more layers of anti-reflective material may differ from a refractive index of an adjacent layer of an anti-reflective material by at least 0.05.

In some examples, the one or more layers of anti-reflective material may withstand repeated cycles of deformation of up to 12% engineering strain without yield strain or yield failure.

In one example, a system may include a head-mounted device. In some examples, the head-mounted device may include a pair of optical lens assemblies. In some examples, each of the pair of optical lens assemblies may include a deformable bounding element bonded to a structural support element, and at least one layer of an anti-reflective material applied to a surface of the deformable bounding element. In some examples, the one or more layers of anti-reflective material may have an elastic modulus of less than 50 GPa.

In some examples, the one or more layers of anti-reflective material may withstand repeated cycles of deformation of up to 12% engineering strain without yield strain or yield failure. In some examples, a refractive index of each of the one or more layers of anti-reflective material may differ from a refractive index of an adjacent layer of an anti-reflective material by at least 0.05.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Figure 1A:
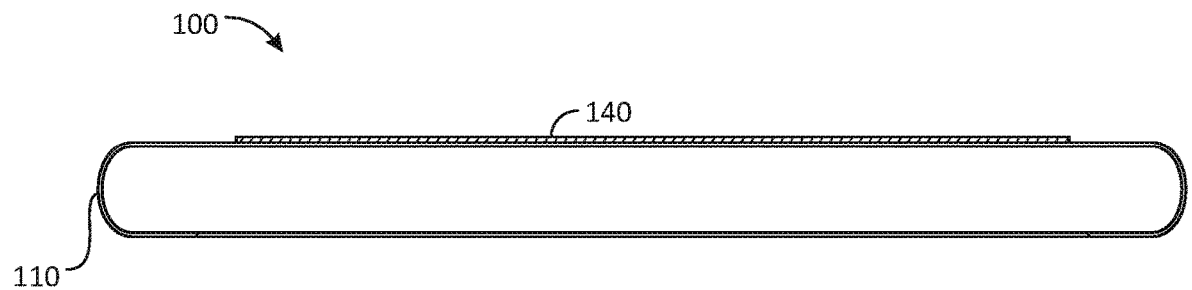
FIG. 1a illustrates a lens with an anti-reflective coating.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

This disclosure is generally directed to methods, apparatuses and systems for coating optical devices (e.g., an optical lens assembly) with anti-reflective treatments. For example, an optical lens assembly may include a deformable bounding element that may be coated with anti-reflective treatments. In some examples, various methods of coating a deformable bounding element with an anti-reflective treatment may involve chemical vapor deposition, thermal evaporation, and spin coating. In some examples, the materials used to coat the deformable bounding element which provide the anti-reflective properties may include various types of polymers and nanoparticles. In some examples, the anti-reflective material may be applied to a pre-stretched or unstretched deformable bounding element during the coating process.

According to some examples, by applying the anti-reflective coating to the deformable bounding element while the deformable bounding element is pre-stretched, the coated deformable bounding element may withstand greater amounts of deformation during operation of an optical lens assembly without experiencing yield strain or yield failure of the anti-reflective coating. Some manufacturing methods disclosed herein may involve applying the anti-reflective coating to the deformable bounding element while the deformable bounding element is in an unstretched and/or neutral state. In some of these examples, applying the anti-reflective coating without first stretching the deformable bounding element may facilitate the efficient coating of many deformable bounding elements (and/or a sheet of material from which many deformable bounding elements may be formed).

In some examples, using a pre-stretched deformable bounding element during the coating process provides advantages over using an unstretched deformable bounding element during the coating process. One advantage of using a pre-stretched deformable bounding element during the coating process is the ability to use a wider range of materials for the anti-reflective coating which are capable of withstanding multiple cycles of deformation. Materials that may be used for the anti-reflective coating on a pre-stretched deformable bounding element may include, without limitation, nanocomposite material, including monomers, or polymers, or a combination thereof, mixed with ceramic particles, where the ceramic particles may have any suitable size. For example, the ceramic particles may have a size in the range of 10 to 500 nm, in the range of 10 to 200 nm, or in the range of 20 to 100 nm. Examples of ceramic particles which may be included in the nanocomposite material include, without limitation, silicon dioxide, magnesium fluoride, zirconia, titania, hafnium oxide, and aluminum oxide. Examples of monomers which may be included in the nanocomposite material include, without limitation polydimethylsiloxane, other siloxanes, acrylates, epoxies, and isocyanates. Polymer materials which may be used for the anti-reflective coating, either with ceramic particles or alone, include, without limitation, polycarbonates, polyurethanes, acrylates, fluoropolymers, polyvinylidene fluoride, silicones, polystyrene, and epoxies.

In some examples, nanocomposite materials which may be used for the anti-reflective coating on a pre-stretched deformable bounding element employ nanoparticles in polymers. Additionally or alternatively, the materials used for the anti-reflective coating may have a refractive index engineered by design within a range of about 1.5 to 2.0. For example, the refractive index of a nanocomposite may be controlled by adjusting the volume ratio of nanoparticles to polymer. In some examples, the materials used for the anti-reflective coating may have a spherical shape with a diameter of under 100 nm and/or may have an elastic modulus in the range of about 5 to 20 GPa.

In some examples, the anti-reflective material may include a polycarbonate material and/or a polymer material containing carbonate groups. Additionally or alternatively, the anti-reflective material (including, for example, nanovoided polymers) may have a refractive index in the range of about 1.15 to 1.8 or higher. In addition, in some examples, the anti-reflective material may have an elastic modulus in the range of about 0.1 to 10 GPa. In some examples, the anti-reflective material may have an elastic modulus in the range of about 0.1 to 2.5 GPa.

In some examples, the anti-reflective material may include a polyurethane material and/or a polymer composed of organic units joined by carbamate (urethane) links. Additionally or alternatively, the anti-reflective material may have a refractive index in the range of about 1.15 to 1.8. In some examples, the anti-reflective material may have an elastic modulus in the range of about 0.1 to 1.0 GPa.

Applying multiple layers of anti-reflective materials to a deformable bounding element may result in an anti-reflective treatment which reduces unwanted reflected light from entering the optical lens assembly. In some examples, each layer of anti-reflective material may have a different index of refraction. Coating a deformable bounding element with anti-reflective treatments using the methods described herein may produce an optical lens assembly capable of withstanding repeated deformations without degradation or failure.

Deformable optical elements, as described herein, may provide one or more advantages over other deformable optical elements. For example, deformable optical elements with anti-reflective coatings may provide adjustable optical power within very small form factors, e.g., for very thin and relatively light-weight optical lenses. Furthermore, deformable optical elements with anti-reflective coatings may provide one or more advantages over other optical lenses with anti-reflective coatings. For example, as will be described in greater detail below, deformable optical elements with anti-reflective coatings may dynamically adjust (e.g., to change optical power) for any of a wide variety of applications, including vision correction and/or resolving vergence-accommodation conflicts. As will be explained in greater detail below, in some examples the methods for coating optical elements described herein may also provide a reduction in reflected light. In some examples, deformable optical elements with anti-reflective coatings capable of withstanding repeated cycles of deformation may be integrated into a device such as a head-mounted display system and may provide high reliability and durability, thus increasing the performance of the head-mounted display (HMD) and its utility to the user.

In one example, deformable optical elements with anti-reflective coatings may be used within devices with minimal form factors, such as head-mounted display devices with an eyeglass form factor. As may be appreciated, head-mounted display systems with anti-reflective coatings capable of withstanding repeated cycles of deformation without failing may improve user comfort, experience, social acceptability, and/or immersion.

FIG. 1a illustrates an example of a deformable lens with an anti-reflective coating. As shown in FIG. 1a, a lens assembly 100 may include a deformable optical lens 110 and an anti-reflective coating 140. Anti-reflective coating 140 may reduce glare and unwanted reflected light from entering rigid and non-deformable optical lens 110 thereby increasing the comfort of a user wearing optical devices which include anti-reflective coating 140. The lens assembly 100 may form a cavity that is filled with a fluid (not shown). Suitable fluids may include, without limitation, fluorocarbons, silicones, phenyl silicones, and other fluids.

Figure 1B:
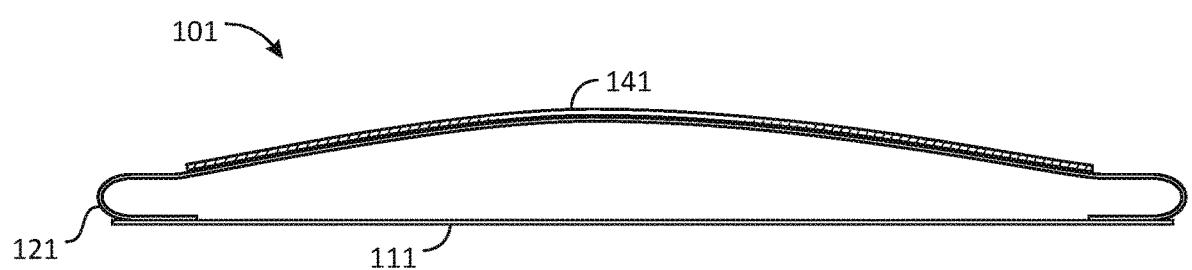
FIG. 1b illustrates a problem associated with a deformable bounding element having an anti-reflective coating.
Figure 1C:
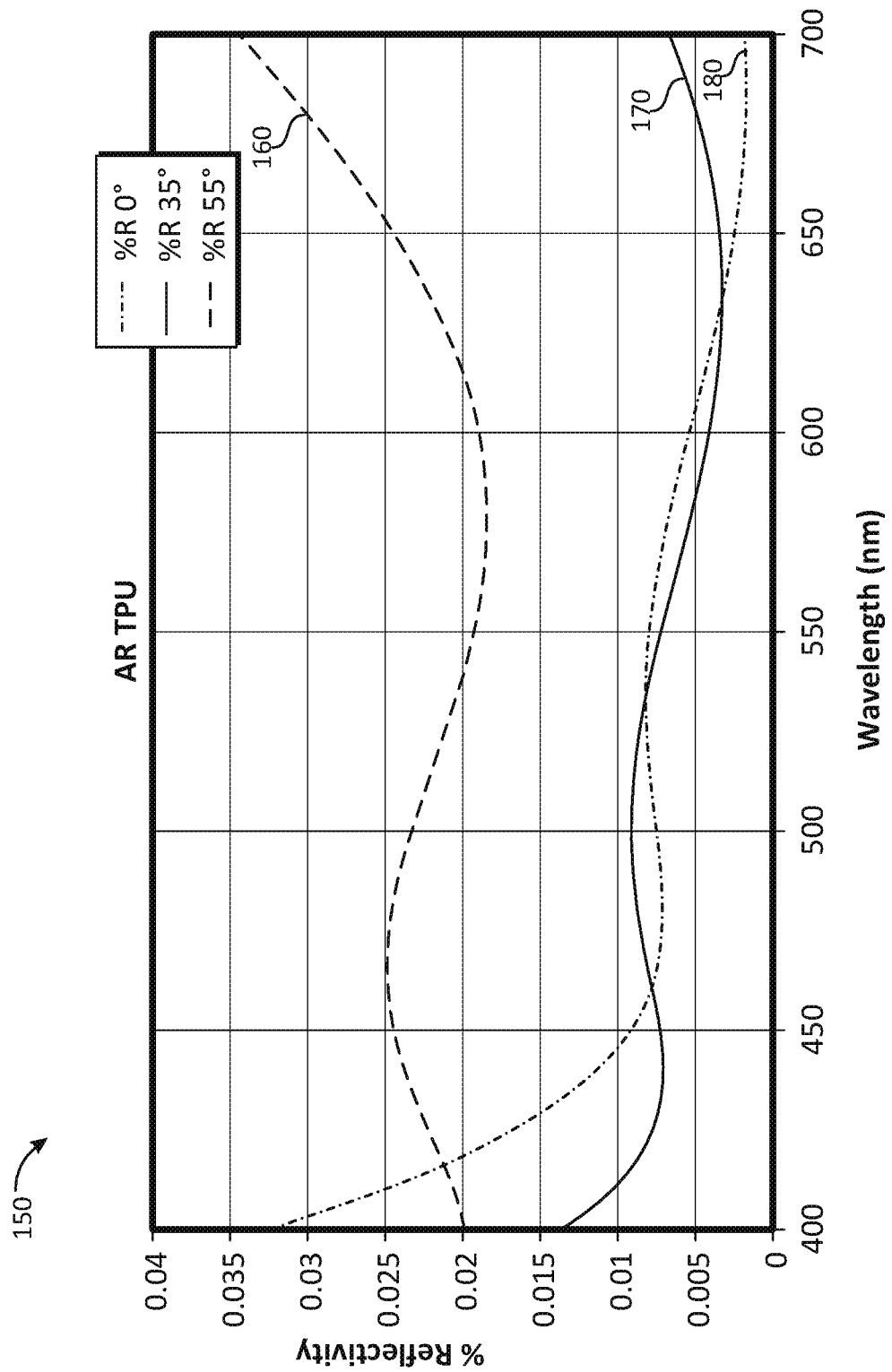
FIG. 1c is a graph illustrating the average reflectivity of a thermoplastic polyurethane (TPU) coated with an anti-reflective material.

FIG. 1b illustrates an example of a deformable optical lens shown in FIG. 1a, with the optical lens assembly 101 having been deformed into a convex shape. As shown in FIG. 1b, an optical lens assembly 101 may include a structural support element 111, a deformable bounding element 121, and an anti-reflective coating 141. Deformable bounding element 121 may be repeatedly deformed by a force or pressure acting on deformable bounding element 121. As will be discussed in greater detail below, the force or pressure may be applied in any of a variety of ways (including, e.g., via a force distributor). When deformable bounding element 121 is repeatedly deformed, anti-reflective coating 141 on the surface of deformable bounding element 121 may also be repeatedly deformed. In some examples, anti-reflective coating 141 may be unable to retain an elastic form due to the repeated cycles of deformation and therefore experience yield strain or yield failure. Yield failure may occur when anti-reflective coating 141 reaches the limits of elastic behavior and is unable to withstand further cycles of deformation while providing anti-reflective properties. In order to overcome the potential deficiencies of repeatedly deforming the antireflective coating as described in FIG. 1b (e.g., the anti-reflective coating experiences yield strain or yield failure), various methods of coating the deformable bounding element with an anti-reflective coating capable of withstanding multiple deformations may involve applying the anti-reflective coating using, for example, initiated chemical vapor deposition, thermal evaporation, and/or spin coating. In some examples, the anti-reflective material may be applied to a pre-stretched or unstretched deformable bounding element during the coating process. In some examples, the deformable bounding element with an anti-reflective coating may be capable of withstanding at least 100 cycles of engineering stress of at least 1% and maintain optical quality in accordance with International Standards Organization (ISO) standard 13468 ("Plastics—Determination of the total luminous transmittance of transparent materials"). In some examples, the optical haze of the anti-reflective coating may be less than 3% after the deformable bounding element withstands 100 cycles of biaxially stretching by at least 1%. FIG. 1c is a graph illustrating the average reflectivity of a thermoplastic polyurethane (TPU) coated with an anti-reflective material. As shown in FIG. 1c, graph 150 shows on the vertical axis a linear scale of reflectivity of TPU coated with an anti-reflective material as measured in percentile under the conditions that there was no reflection from the interface between the TPU and a fluid contained within the TPU. The horizontal axis of graph 150 shows a linear scale of visible wavelength of unpolarized light as measured in nanometers. Three curves are shown in graph 150, each indicating a different angle of incidence to the anti-reflective coating. Curve 160 shows the average reflectivity of TPU coated with an anti-reflective material over visible light wavelengths ranging from 400 to 700 nanometers for unpolarized light entering the surface of the anti-reflective material at an angle of incidence 55 degrees to normal (normal may be defined as perpendicular to the surface of the anti-reflective material). Curve 170 shows the average reflectivity of TPU coated with an anti-reflective material over visible light wavelengths ranging from 400 to 700 nanometers for unpolarized light entering the surface of the anti-reflective material at an angle of incidence 35 degrees to normal. Curve 180 shows the average reflectivity of TPU coated with an anti-reflective material over visible light wavelengths ranging from 400 to 700 nanometers for light entering the surface of the anti-reflective material at an angle of incidence 0 degrees to normal. Curve 180 shows that the average reflectivity of a deformable bounding element coated with multiple layers of an anti-reflective material for frequencies of light between 400 nanometers and 700 nanometers which enters a surface of the anti-reflective coating at an angle of incidence normal to a major plane of the surface of the anti-reflective coating may be less than 2%.

In some examples, the optical reflection haze of a deformable bounding element coated with multiple layers of an anti-reflective material may be less than 1% for 550-nanometer light when measured for collimated light outside a 2-degree cone. The longitudinal axis of the 2-degree cone may be normal to the surface of the deformable bounding element.

Figure 2:
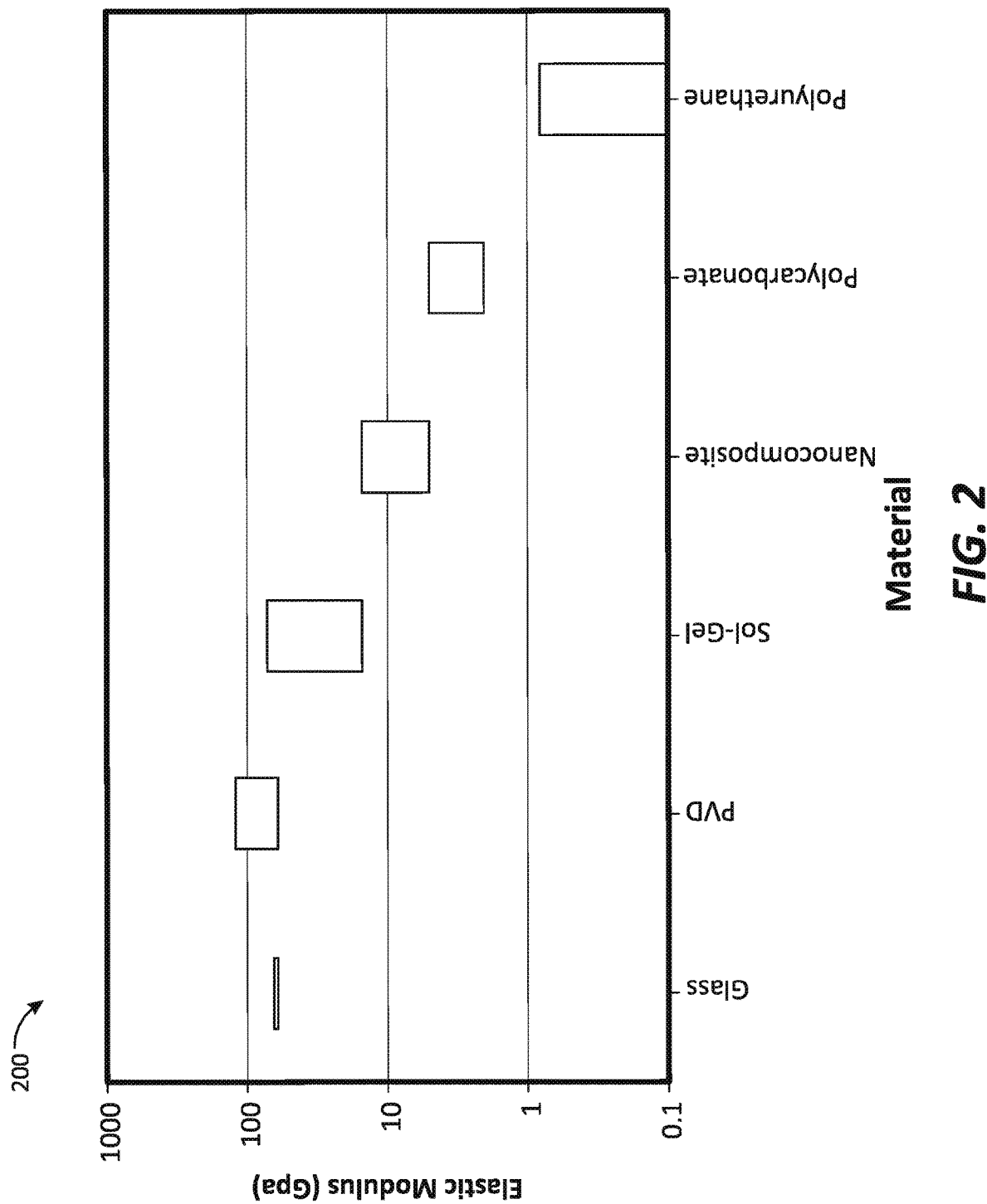
FIG. 2 is a graph illustrating the elastic modulus of various materials.

FIG. 2 is a graph illustrating the elastic modulus of various materials. In FIG. 2, graph 200 shows the vertical axis as a log scale of elastic modulus of various materials as measured in gigapascals (GPa) and the horizontal axis shows various materials which may be included in an optical lens assembly. An elastic modulus may be a measure of an object or material's resistance to being deformed elastically (i.e., non-permanently) when a stress is applied to it. The elastic modulus of an object or material may be determined by the slope of its stress-strain curve in the elastic deformation region. A stiffer material may have a higher elastic modulus. Graph 200 shows the elastic modulus of glass and physical vapor deposited (PVD) inorganic coatings may have a relatively higher elastic modulus and therefore may be stiffer materials. Graph 200 shows the elastic modulus of Sol-Gel, nanocomposite, polycarbonate, and polyurethane materials may be relatively lower than glass and PVD and therefore may be more flexible materials. Graph 200 shows polyurethane may have an elastic modulus in the range of about 0.1 GPa to 0.9 GPa. Polyurethanes are a class of polymers with properties that may be suitable for anti-reflective coatings. The anti-reflective materials suitable for coating a deformable bounding element may have an elastic modulus of less than about 50 GPa. The deformable bounding element may include any of a variety of materials. For example, the deformable bounding element may include one or more flexible materials that may be shaped in response to one or more applied forces. In some examples, the deformable bounding element may include one or more tensioned or non-tensioned linear elastic and hyper-elastic polymers (e.g., silicones and thermoplastic polyurethane (TPU), etc.). In some examples, the deformable bounding element may have a Young's modulus of less than about 50 gigapascals (GPa), less than about 10 GPa, less than about 2 GPa, or less than about 1 GPa.

Table 1 lists a set of example polymers and their respective coating thicknesses and refractive indices. The example polymers listed in Table 1 may be used as anti-reflective coatings on the deformable bounding element. In one example, alternating layers of polymers having different indices of refraction may be applied to the deformable bounding element to form the anti-reflective coating. Table 1 further shows exemplary thicknesses for each alternating layer of the anti-reflective coating and the indices of refraction for each of the polymers. The thicknesses of the anti-reflective coating may be sufficient to provide anti-reflective properties to the deformable bounding element while maintaining structural integrity. The alternating layers of the anti-reflective coating may have a refractive index that differs from an adjacent layer by at least 0.05 or more, by at least about 0.15 or more, by at least about 0.20 or more, by at least about 0.25 or more, by at least about 0.32 or more, by at least about 0.35 or more, or by at least about 0.40 or more. The performance of the anti-reflective coating may be dependent upon the number of layers, the thickness of the individual layers, and the refractive index difference at the layer interfaces. The different index of refraction for each of the adjacent layers of the anti-reflective coating may control the reflection and transmission of light through the mechanism of optical interference. In some examples, the alternating layers of the anti-reflective coating may be non-porous and/or may not be permeable to water, air, or other fluid.

As mentioned above, the alternating layers of anti-reflective coating may have a high refractive index material adjacent to a low refractive index material. Examples of high refractive index materials may include, but are not limited to, Poly(pentabromophenyl methacrylate) (PPBPMA), Poly(pentabromophenyl acrylate), Poly(pentabromobenzyl methacrylate), Poly(pentabromobenzyl acrylate), Poly(2,4,6-tribromophenyl methacrylate), Poly(vinylphenylsulfide), Poly(l-napthyl methacrylate), Poly(2-vinylthiophene), Poly(2,6-dichlorostyrene), Poly(N-vinylphthalimide), Poly(2-chlorostyrene), and Poly(pentachlorophenyl methacrylate).

Examples of low refractive index materials which may be applied adjacent to high index of refraction materials may include, but are not limited to, Poly(1,1,1,3,3,3-hexafluoroisopropyl acrylate) (PHFIA), Poly(2,2,3,3,4,4,4-heptafluorobutyl acrylate), Poly(2,2,3,3,4,4,4-heptafluorobutyl methacrylate), Poly(2,2,3,3,3-pentafluoropropyl acrylate), Poly(1,1,1,3,3,3-hexafluoroisopropyl methacrylate), Poly(2,2,3,4,4,4-hexafluorobutyl acrylate), Poly(2,2,3,4,4,4-hexafluorobutyl methacrylate), Poly(2,2,3,3,3-pentafluoropropyl methacrylate), Poly(2,2,2-trifluoroethyl acrylate), Poly(2,2,3,3-tetrafluoropropyl acrylate), Poly(2,2,3,3-tetrafluoropropyl methacrylate), and Poly(2,2,2-trifluoroethyl methacrylate).

Additional examples materials of the anti-reflective coating may include, without limitation, silica particles, silica particle-polymer hybrids, polymer particles and films, composites (e.g., silica-Teflon, spirooxazine-doped polystyrene), vinyltrimethoxy silane films, silicon dioxide ($SiO_2$)/titanium dioxide ($TiO2$) particles, and $TiO2$ film.

TABLE 1

| Material | Thickness | Refractive Index |
|---|---|---|
| Aliphatic TPU | N/A | 1.495 |
| Poly(pentabromophenyl methacrylate) | 35 | 1.71 |
| Poly(1,1,1,3,3,3-hexafluoroisopropyl acrylate) | 9 | 1.375 |
| Poly(pentabromophenyl methacrylate) | 111 | 1.71 |
| Poly(1,1,1,3,3,3-hexafluoroisopropyl acrylate) | 105 | 1.375 |

In some examples, the antireflective coating may be a multilayer coating or a single layer coating of a low index polymer with an optical thickness of about ¼ of the center wavelength of light where reflectivity is minimized.

The deformable bounding element may be coated with multiple layers of anti-reflective materials. The multiple layers of anti-reflective coating may be applied to the deformable bounding element when the deformable bounding element is stretched during the coating process or unstretched during the coating process. As an example, the deformable bounding element may be stretched by an amount substantially equivalent to an amount of stretching during operation in an optical lens assembly. According to various additional examples, the deformable bounding element may be stretched by the amount of stretching during operation in an optical lens assembly plus at least an additional 2%, at least an additional 5%, at least an additional 10%, or at least an additional 20% during the coating process. According to some examples, after fixing or bonding the deformable bounding element to a support, the deformable bounding element may maintain a portion of the initial stretching amount. According to various examples, the deformable bounding element may maintain at least about 10%, at least about 30%, at least about 50%, or at least about 70% of the initial stretching amount during the coating process.

The amount of stretching of the deformable bounding element during the coating process may remain constant during the coating process or may vary during the coating process. The deformable bounding element may be stretched in any number of directions. For example, the deformable bounding element may be stretched uniaxially (e.g., tensioned in one direction) or biaxially (e.g., tensioned in two directions). The deformable bounding element may be stretched uniformly, in which there is substantially the same amount of tension in all directions across the deformable bounding element, or non-uniformly, in which there is a differing amount of tension in different directions across the deformable bounding element and/or where there is a differing amount of tension across the deformable bounding element in any single direction. When stretching the deformable bounding element biaxially, a sequential stretching method may be used which first stretches the deformable bounding element in a first direction and then stretches the deformable bounding element in a second direction. The first and second directions may be perpendicular to one another. Alternatively or additionally, when stretching the deformable bounding element biaxially, the stretching may occur simultaneously in both the first and second directions.

As an example, the optical lens assembly may include the deformable bounding element bonded to a structural support element and a cavity between the deformable bounding element and the structural support element may be filled with a deformable medium. The deformable bounding element may have a set tension when in a neutral state. In some examples, the term "neutral state" as it relates to the deformable bounding element may refer to the state of the deformable bounding element when the deformable bounding element is bonded to a structural support element and the cavity is filled with a deformable medium. Additionally or alternatively, the term "neutral state" as it relates to the deformable bounding element may refer to the state of the deformable bounding element when an adjustable optical lens that includes the deformable bounding element has zero optical power. According to some examples, the term "neutral state" as it relates to the deformable bounding element may refer to the state of the deformable bounding element when an adjustable optical apparatus that includes the deformable bounding element is not actuated and/or in an unactuated state. Additionally or alternatively, the term "neutral state" as it relates to the deformable bounding element may refer to the lowest-tension state of the deformable bounding element across all adjustment states of an adjustable optical apparatus that includes the deformable bounding element. In some examples, the amount of tension on the deformable bounding element may be lower in the neutral state than the amount of tension on the deformable bounding element when the deformable bounding element is stretched during the coating process.

Figure 3A:
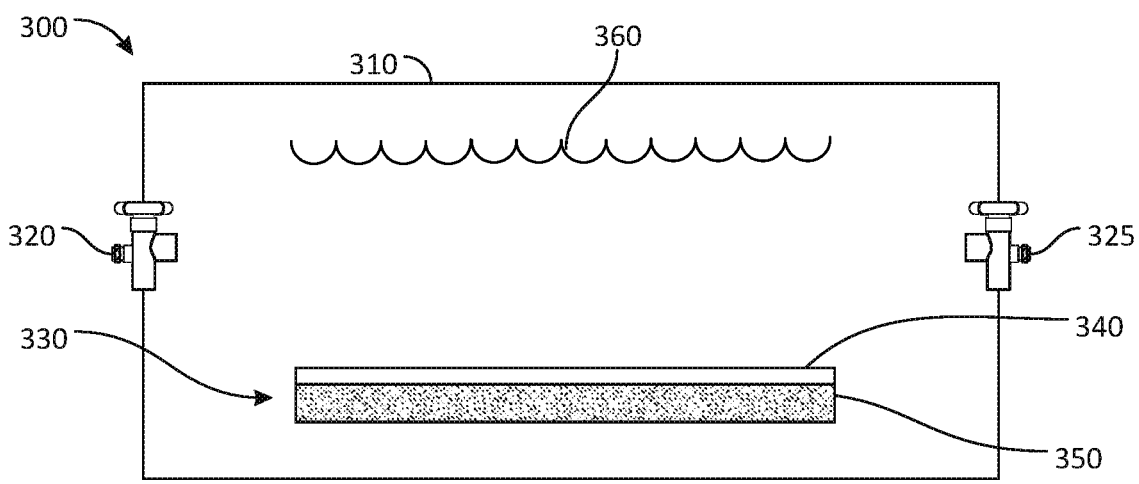
FIG. 3a illustrates a method of coating a sheet of a deformable bounding element using a chemical vapor deposition process.

FIG. 3a illustrates an example method of coating a sheet of a deformable bounding element with an anti-reflective material using a chemical vapor deposition process. As shown in FIG. 3a, a method of coating a sheet of a deformable bounding element using an initiated chemical vapor deposition (iCVD) process may include a coating apparatus 300, a chamber 310, an inlet valve 320, an exhaust valve 325, an encasing envelope 330, a deformable bounding element 340, a support 350, and an array of heating filaments 360.

In some examples, deformable bounding element 340 may be disposed in chamber 310 adjacent to support 350. Support 350 may be fixed in chamber 310. Deformable bounding element 340 may be stretched uniaxially or biaxially into a stretched state before applying the anti-reflective coating. At least one edge of deformable bounding element 340 may be bonded to support 350 before stretching deformable bounding element 340. Various example methods of bonding the edge of deformable bounding element 340 to support 350 before coating may include heat bonding, ultrasonic welding or adhesives such as glue, paste, resin, sealant, cement, and epoxy. The materials used in the bonding process may be compatible with the materials used in deformable bounding element 340. Deformable bounding element 340 may be stretched by a range of 0% to about 20% during the coating process. Deformable bounding element 340 may also be fixed adjacent to support 350 in an unstretched state in which there may be no tension on the surface of deformable bounding element 340 during the coating process.

The iCVD process may include opening inlet valve 320 which may allow a suitable first monomer and a corresponding first monomer initiator to fill chamber 310. In some examples, the first monomer may be in the form of a gas which is carried by an inert gas carrier. Examples of the inert gas carrier may include, without limitation, nitrogen or argon. The first monomer may include a monomer that forms the desired polymer. A large number of the first monomers may combine to form polymers through a polymerization process. The first monomer initiator may include any chemical species that reacts with the first monomer to form an intermediate compound capable of linking successively with a large number of first monomers into the first polymer compound. The first monomer initiator may produce free radicals (e.g., reactive atoms or groups of atoms that contain an unpaired valence electron). Additionally or alternatively, the first monomer initiator may be the first monomer. In this case, activation energy may be applied to the first monomer in order to cause the polymerization process of the first monomer. For example, the activation energy may be actinic radiation which may create the free radical in the first monomer and may begin a free-radical polymerization chain reaction.

Referring again to FIG. 3*a*, an energized array of heating filaments 360 may generate heat to activate the first monomer initiator. During the polymerization process, the activation of the first monomer initiator may cause a chemical reaction which may result in a vapor being applied onto the surface of deformable bounding element 340. The vapor may create a first polymer layer on the surface of deformable bounding element 340. The polymer may be formed when the first monomer initiator causes the first monomers to covalently bond into the polymer. The iCVD process may further include opening exhaust valve 325 which may release the spent vapor from chamber 310. In some examples, chamber 310 may be purged with a gas and/or a vacuum may be applied to chamber 310 to remove the first monomer initiator. The above described process may be used to coat deformable bounding element 340 with at least one layer of the anti-reflective coating.

The iCVD process may further include opening inlet valve 320 which may allow a suitable second monomer and a corresponding second monomer initiator to fill chamber 310. In some examples, the second monomer may be in the form of a gas which is carried by an inert gas carrier. Examples of the inert gas carrier may include, without limitation, nitrogen or argon. The second monomer and the second monomer initiator may react to form a second polymer similar to the process described above with respect to the first monomer and the first monomer initiator forming a first polymer. An energized array of heating filaments 360 may generate heat to activate the second monomer initiator. The activation of the second monomer initiator may cause a chemical reaction which may result in a vapor being applied onto the surface of deformable bounding element 340. The vapor may create a second polymer layer on the surface of deformable bounding element 340. The polymer may be formed when the second monomer initiator causes the second monomers to covalently bond into the polymer. Additionally or alternatively, the second monomer initiator may be the second monomer. In this case, activation energy may be applied to the second monomer in order to cause the polymerization process of the second monomer. For example, the activation energy may be actinic radiation which may create the free radical in the second monomer and may begin a free-radical polymerization chain reaction. The iCVD process may further include opening exhaust valve 325 which may release the vapor from chamber 310. Chamber 310 may be purged with a gas and/or a vacuum may be applied to chamber 310 to remove the second monomer initiator.

The above described process with respect to FIG. 3*a* may be repeated multiple times to form alternating layers of a multilayer anti-reflective coating. In some examples, each of the alternating layers of anti-reflective coating may have a refractive index that differs from an adjacent layer (e.g., at least by a set amount).

Figure 3B:
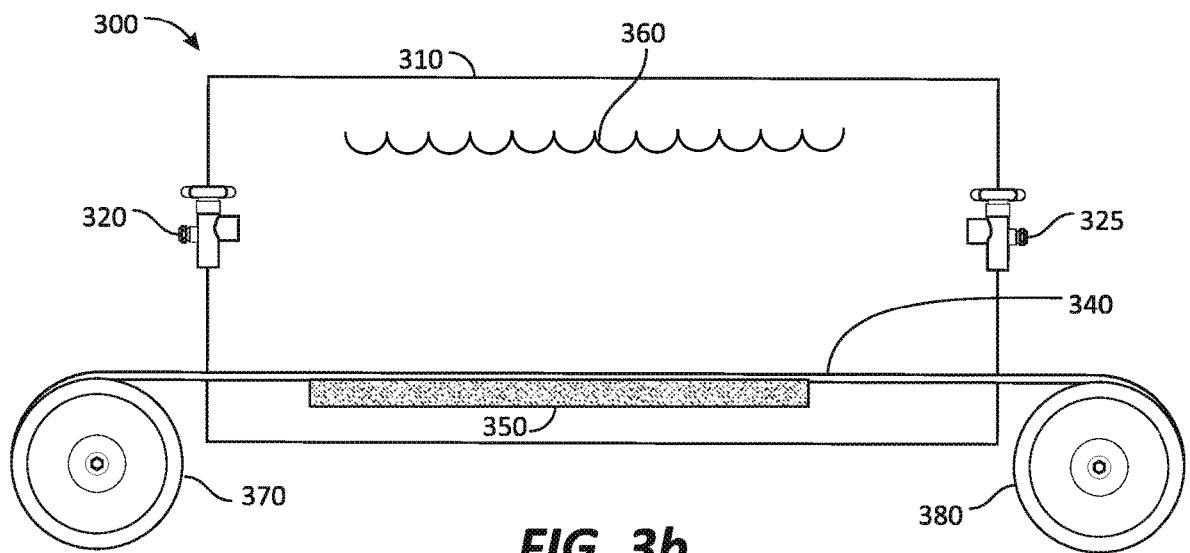
FIG. 3b illustrates a method of coating a roll of a deformable bounding element using a chemical vapor deposition process.

FIG. 3*b* illustrates an example method of coating a roll of a deformable bounding element with an anti-reflective material using an iCVD process. As shown in FIG. 3*b*, a method of coating a roll of a deformable bounding element using an iCVD process may include a coating apparatus 300, a chamber 310, an inlet valve 320, an exhaust valve 325, a deformable bounding element 340, a support 350, an array of heating filaments 360, and sheet rollers 370 and 380.

In some examples, deformable bounding element 340 may be disposed in chamber 310 adjacent to support 350. Support 350 may be fixed in chamber 310. Deformable bounding element 340 may be in the form of a roll and fed from sheet roller 370 to sheet roller 380. Deformable bounding element 340 may be stretched uniaxially or biaxially into a stretched state before applying the anti-reflective coating as described above with respect to FIG. 3*a*. At least one edge of deformable bounding element 340 may be bonded to support 350 before stretching deformable bounding element 340. Deformable bounding element 340 may also be fixed adjacent to support 350 in an unstretched state in which there may be no tension on the surface of the deformable bounding element during the coating process.

In some examples, the iCVD process may include opening inlet valve 320 which may allow a suitable first monomer and a corresponding first monomer initiator to fill chamber 310. In some examples, the first monomer may be in the form of a gas which is carried by an inert gas carrier. Examples of the inert gas carrier may include, without limitation, nitrogen or argon. An energized array of heating filaments 360 may generate heat to activate the first monomer initiator. Similar to the process described above with respect to FIG. 3*a*, the activation of the first monomer initiator may cause a chemical reaction which may result in a vapor being applied onto the surface of deformable bounding element 340. The vapor may create a first polymer layer on the surface of deformable bounding element 340. The polymer may be formed when the first monomer initiator causes the first monomers to covalently bond into the polymer. Additionally or alternatively, the first monomer initiator may be the first monomer. In this case, activation energy may be applied to the first monomer in order to cause the polymerization process of the first monomer itself. For example, the activation energy may be actinic radiation which may create the free radical in the first monomer and begin a free-radical polymerization chain reaction. The iCVD process may further include opening exhaust valve 325 which may release the spent vapor from chamber 310. Chamber 310 may be purged with a gas and/or a vacuum may be applied to chamber 310 to remove the first monomer initiator. In some examples, the above described process may be used to coat a section of the roll of deformable bounding element 340 with the anti-reflective coating. Rollers 370 and 380 may rotate to advance an adjacent section of the roll of deformable bounding element 340 into chamber 310. The iCVD process may be repeated as described above to coat the adjacent section of deformable bounding element 340. The entire iCVD process may be repeated until all sections of the roll are coated with the first polymer layer. In another example, rollers 370 and 380 may rotate continuously to advance the roll of deformable bounding element 340 through chamber 310 while the anti-reflective coating is applied.

As shown in FIG. 3B, the iCVD process for applying a second layer of the anti-reflective coating to a roll of deformable bounding element may include opening inlet valve 320 which may allow a suitable second monomer and a corresponding second monomer initiator to fill chamber 310. In some examples, the second monomer may be in the form of a gas which is carried by an inert gas carrier. Examples of the inert gas carrier may include, without limitation, nitrogen or argon. An energized array of heating filaments 360 may generate heat to activate the second monomer initiator. The activation of the second monomer initiator may cause a chemical reaction which results in a vapor being applied onto the surface of deformable bounding element 340. The vapor may create a layer of a second polymer on the surface of deformable bounding element 340. The polymer may be formed when the second monomer initiator causes the second monomers to covalently bond into the polymer. Additionally or alternatively, the second monomer initiator may be the second monomer. In this case, activation energy may be applied to the second monomer in order to cause the polymerization process of the second monomer itself. For example, the activation energy may be actinic radiation which may create the free radical in the second monomer and begin a free-radical polymerization chain reaction. The iCVD process may further include opening exhaust valve 325 which may release the spent vapor from chamber 310. Chamber 310 may be purged with a gas and/or a vacuum may be applied to chamber 310 to remove the second monomer initiator. As described above with respect to applying a first layer of the anti-reflective coating to a roll of deformable bounding element 340, the iCVD process may continue by applying the second layer to each section of the roll, or by continuously feeding the roll through chamber 310 during the process. The coating process shown in FIG. 3*b* may include support 350.

The above described process with respect to FIG. 3*b* may be repeated multiple times to form alternating layers of a multilayer anti-reflective coating. Each of the alternating layers of anti-reflective coating may have a refractive index that differs from an adjacent layer by at least about 0.05.

Figure 4:
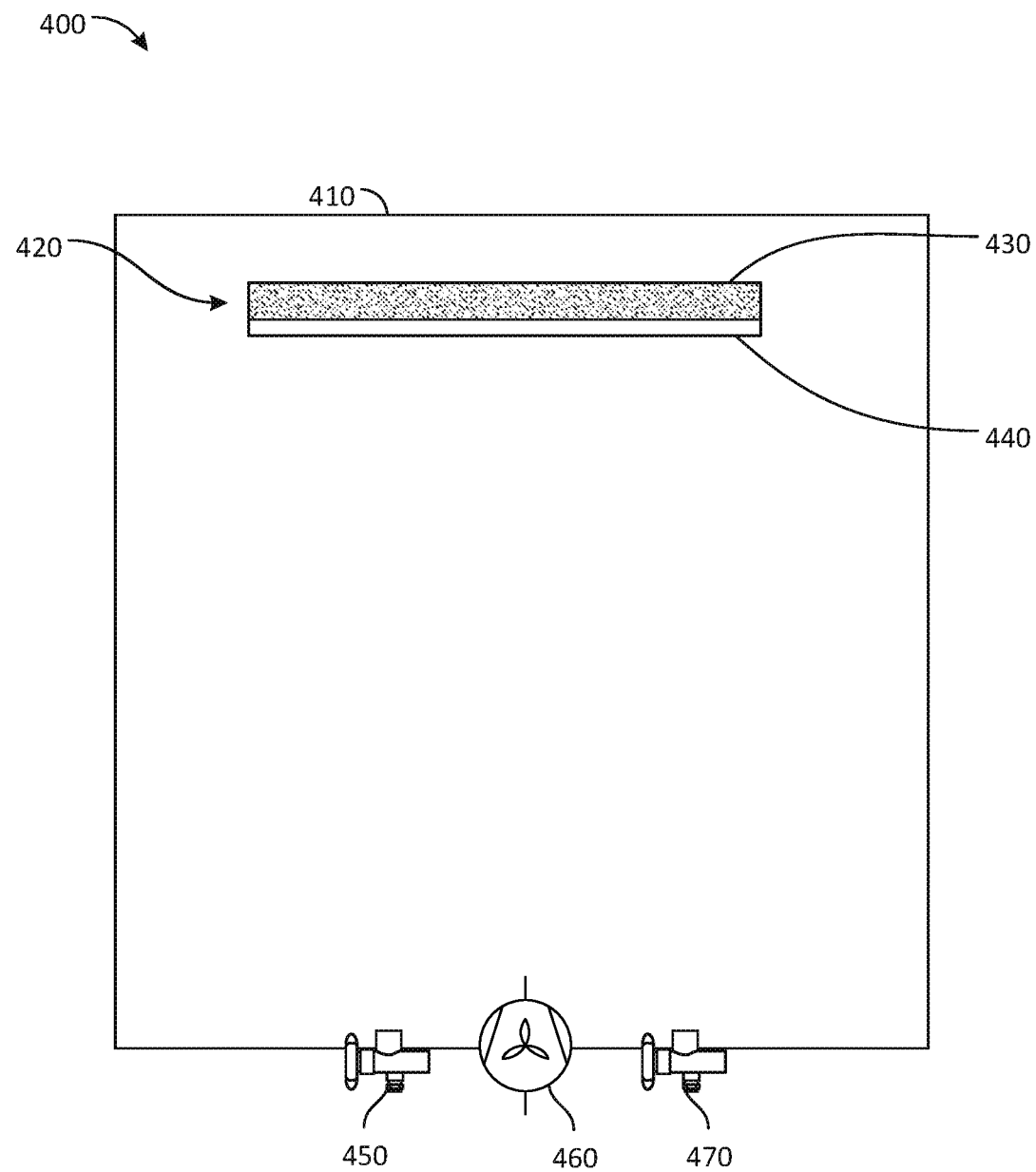
FIG. 4 illustrates a method of coating a deformable bounding element using a thermal evaporation process.

FIG. 4 illustrates an example method of coating a deformable bounding element using a thermal evaporation process. As shown in FIG. 4, a method of coating a sheet of a deformable bounding element using a thermal evaporation process may include a coating apparatus 400, a chamber 410, inlet valves 450 and 470, an encasing envelope 420, a deformable bounding element 440, a support 430, and an activation energy system 460.

In some examples, deformable bounding element 440 may be disposed in chamber 410 adjacent to support 430. Support 430 may be fixed in chamber 410. Deformable bounding element 440 may be stretched uniaxially or biaxially into a stretched state before applying the anti-reflective coating in a method similar to the stretching process described above in FIG. 3*a*. At least one edge of deformable bounding element 440 may be bonded to support 430 before stretching deformable bounding element 440. Deformable bounding element 440 may also be fixed adjacent to support 430 in an unstretched state in which there may be no tension on the surface of deformable bounding element 440 during the coating process.

The thermal evaporation process may include opening inlet valve 450 which may allow a first monomer to fill chamber 410 as a vapor. After chamber 410 is filled with the first monomer, vapor inlet valve 450 may be closed to seal chamber 410. Activation energy system 460 may direct activation energy against the surface of deformable bounding element 440 causing polymerization of the first monomer and forming a first polymer layer. Activation energy system 460 may be any type of system which causes chemical reactions produced by radiant energy. Activation energy system 460 may generate radiant energy via any suitable source, including, without limitation, a heat source, an x-ray source, an electron beam, an electromagnetic radiation source, an ultraviolet light source, or a visible light source. In some examples, the thermal evaporation process may use the electrons of an electron beam to form free radicals in the first monomer itself. Inlet valve 470 may be opened which may allow a second monomer to fill chamber 410 as a vapor. After chamber 410 is filled with the second monomer vapor, inlet valve 470 may be closed to seal chamber 410. Activation energy system 460 directs activation energy against the surface of deformable bounding element 440 causing polymerization of the second monomer and forming a second polymer layer on the first polymer layer. In some examples, the thermal evaporation process may use the electrons of an electron beam to form free radicals in the second monomer itself. Additionally or alternatively, chamber 410 may include a heated container injected with monomers. The monomers may evaporate from the heated container and coat the deformable bounding element 440.

The above described process with respect to FIG. 4 may be repeated multiple times to form alternating layers of a multilayer anti-reflective coating. Each of the alternating layers of anti-reflective coating may have a refractive index that differs from an adjacent layer (e.g., at least by a set amount).

Similar to the iCVD processes described with respect to FIGS. 3*a* and 3*b*, the thermal evaporation process described with respect to FIG. 4 may be performed with deformable bounding element 440 in the form of a sheet or in the form of a roll.

Additionally or alternatively, the anti-reflective coating may be applied to the deformable bounding element using a spin coating process. In the spin coating process, the deformable bounding element may be fixed or bonded to a support. The deformable bounding element may be stretched uniaxially and/or biaxially or unstretched before fixing or bonding the deformable bounding element to the support. The anti-reflective material may be in the form of a liquid or a gel and applied to the center of the deformable bounding element. The support and the deformable bounding element may then be rotated rapidly to a desired rotation rate. The anti-reflective material may flow radially on the surface of the deformable bounding element to which it was applied due to the action of centrifugal force. The anti-reflective material may spread out over the surface of the deformable bounding element until disjoining pressure effects cause the anti-reflective material coating to reach an equilibrium thickness. As an example, the anti-reflective material used in the spin coating process may be a liquid solution which may include a polymer and/or nano-ceramic filler particles. The liquid solution may be formed using a sol-gel process which mixes nanoparticles within a solution. The nanoparticles may include any of a variety of materials, including, without limitation, silica, ceramic, ceria, or a combination thereof. In various examples, the anti-reflective material used in the spin coating process may have an elastic strain limit that is at least about 1%, at least about 2%, at least about 3%, or at least about 4%. Other anti-reflective materials, such as those in Table 1, may also be used in the spin coating process.

As an example, after the deformable bounding element has been coated with multiple layers of an anti-reflective coating and integrated into an optical lens assembly, the deformable bounding element may experience repeated deformations due to the force generated by an actuator disposed on a perimeter edge of the optical lens assembly. The anti-reflective coating on the surface of the deformable bounding element may also experience the repeated deformations and may be able to withstand engineering strain substantially equivalent to (and/or greater than) the amount of engineering strain experienced during operation in an optical lens assembly. In various examples, anti-reflective coating on the surface of the deformable bounding element may be able to withstand up to 5% engineering strain, up to 10% engineering strain, up to 15% engineering strain, or up to 20% engineering strain while retaining its form and shape without yield strain or yield failure. Engineering strain may be expressed as the ratio of total deformation of the anti-reflective coating after the deformable bounding element is deformed to the initial dimension of the anti-reflective coating before the deformable bounding element is deformed. Yield failure may occur when the anti-reflective coating reaches the limits of elastic behavior.

Figure 5:
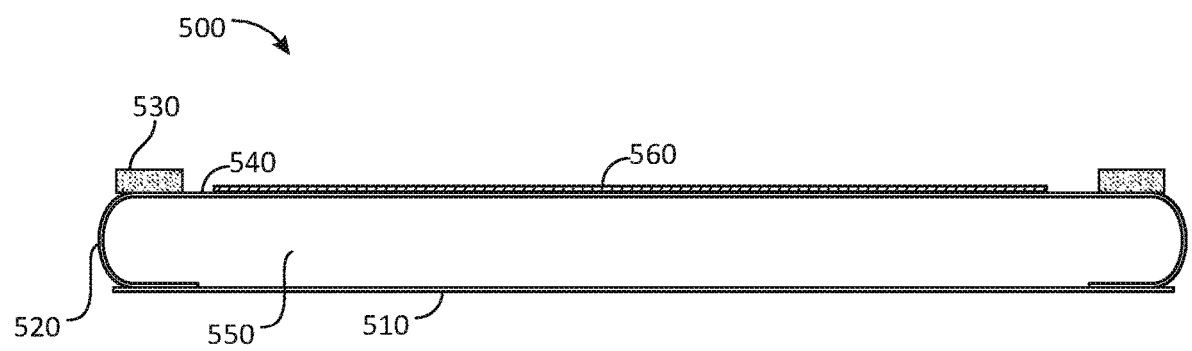
FIG. 5 illustrates a cross section of an optical lens assembly with a deformable bounding element.

FIG. 5 illustrates an example of a cross section of an optical lens assembly with a deformable bounding element. As shown in FIG. 5, an optical lens assembly 500 may include a structural support element 510, an edge seal 520, a force distributor, 530, a deformable bounding element 540, a deformable medium cavity 550 containing a fluid, and multiple layers of anti-reflective coating 560. Edge seal 520 may seal deformable bounding element 540 to the edge of structural support element 510. Edge seal 520 may contain a deformable medium within cavity 250. Force distributor 530 may couple deformable bounding element 540 to an external actuation mechanism. A force applied by the external actuation mechanism to force distributor 530 may distribute the force to the perimeter of deformable bounding element 540 causing the surface of deformable bounding element 540 to deform and thereby modify an optical property. Deformable medium cavity 550 may be encapsulated between deformable bounding element 540 and structural support element 510. Multiple layers of anti-reflective coating 560 may be disposed on the surface of deformable bounding element 540. The multiple layers of anti-reflective coating 560 may include alternating layers of anti-reflective coating each having a refractive index that differs from an adjacent layer.

Figure 6:
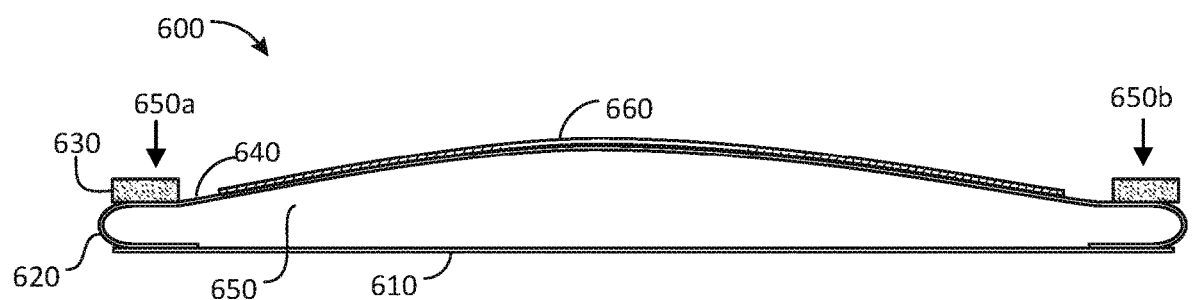
FIG. 6 illustrates a cross section of an optical lens assembly with a deformable bounding element in a deformed state.

FIG. 6 illustrates an example of a cross section of an optical lens assembly with a deformable bounding element in a deformed state. As shown in FIG. 6, an optical lens assembly 600 may include a structural support element 610, an edge seal 620, a force distributor, 630, a deformable bounding element 640, a deformable medium cavity 650 and multiple layers of anti-reflective coating 660. Edge seal 620 may seal deformable bounding element 640 to the edge of structural support element 610. Edge seal 620 may contain a deformable medium within cavity 650. Force distributor 630 may couple deformable bounding element 640 to an external actuation mechanism. A force applied by the external actuation mechanism to force distributor 630 in the directions defined by arrows 650a and 650b may distribute the force to the perimeter of deformable bounding element 640. The resulting pressure created in the fluid in cavity 650 may cause the deformable medium to apply a force against the deformable bounding element 640, which deforms and thereby modifies an optical property of optical lens assembly 600. Multiple layers of anti-reflective coating 660 may be disposed on the surface of deformable bounding element 640. Repeated cycles of actuation to force distributor 630 may cause the multiple layers of anti-reflective coating 660 to experience repeated engineering strains up to 12%. The multiple layers of anti-reflective coating 660 may be capable of withstanding the repeated cycles of deformation without engineering strain or failure. In some examples, an anti-reflective coating may be applied to the fluid-exposed surface of the deformable bounding element 640. The anti-reflective coating may be a thin single layer coating with a thickness in the range of about 50 and 200 nm and having a refractive index that is between the refractive index of the fluid and the refractive index of the deformable bounding element 640. In some examples, a multilayer antireflective coating may be used.

As discussed earlier, the deformable optical lenses discussed herein may be adjusted (e.g., thereby modifying one or more optical properties of the deformable optical lenses). For example, an optical lens assembly may be integrated with an actuator on or near the perimeter of the deformable bounding element. Actuation along the perimeter of the deformable bounding element may apply a force to the perimeter of the deformable bounding element (e.g., downward onto the deformable bounding element, radially inward onto the deformable bounding element, etc.), thereby increasing the pressure of the deformable medium in the cavity. The increased pressure of the deformable medium may apply a force against the deformable bounding element, thereby changing the curvature of the deformable bounding element and its optical power. The direction and magnitude of the applied force may be variable and thus may determine the variable optical power of the deformable optical element. The curvature and focal length of the deformable optical element may be switched from convex to concave. In some examples, optical lens assemblies described herein may be varifocal, have high transmissivity of light, and may achieve low off-axis aberration and distortion for high image display quality over a wide range of optical powers.

The optical lens assemblies produced by the methods of the instant disclosure may also provide a wide aperture which may be free (or substantially free) from obstructions. An optical lens assembly with a wide aperture which is free from obstructions may be integrated into a device such as an HMD and provide an unobstructed wide field of view, thus increasing the performance of the HMD and its value to the user. Some of the methods for filling optical lens assemblies described herein may be applied by filling the optical lens assembly through a perimeter area of the optical lens assembly and, therefore, one or more components used in the filling process which may contribute to an obstruction may be located in the perimeter area. When the optical lens assembly is integrated into an HMD, the perimeter area may be concealed by a bezel of the HMD, thereby maintaining a clear aperture area of the deformable optical element and increasing the performance and comfort of the HMD.

The optical lens assembly produced by the methods of the instant disclosure may also be ultra-thin and lightweight. Filling an optical lens assembly through a hole in the structural support element or past the edge of the structural support element may reduce the thickness of the optical lens assembly. Further, the reduced thickness of the optical lens assembly may reduce the mass of the optical lens assembly and, therefore, its weight. For example, the optical lens assembly may have a thickness less than about 3 mm, less than about 2 mm, less than 1.0 mm, less than about 0.8 mm, less than about 0.7 mm, less than about 0.6 mm, less than about 0.5 mm, or less than about 0.4 mm. In some examples, the optical lens assembly produced by the methods of the instant disclosure may also use materials which are lightweight. An HMD with ultra-thin and lightweight deformable optical elements may be more comfortable for a user to wear for extended periods of time.

The optical lens assembly may also be interfaced or integrated with other components such as ophthalmic lens components, eye tracking components, and/or wave guide components. The optical lens assembly may include a structural support element which may be shaped with a curvature that provides an ophthalmic lens which corrects for vision impairment of the user. The optical lens assembly may also be integrated with an eye tracking system which may track where the user is looking and/or the motion of an eye relative to the head. The eye tracking system may increase functionality and user satisfaction levels in an AR/VR system and may include a selective-transmission element which transmits light having a selected property (e.g., visible light) but does not transmit light that does not have the selected property (e.g., infrared light). The selective-transmission element may be used to facilitate eye tracking in which an infrared light source will be reflected by the selective-transmission element back to an eye-tracking camera. In some examples, when the optical lens assembly includes an ophthalmic lens, light may be reflected and processed differently by the eye-tracking system than when the optical lens assembly does not include an ophthalmic lens. The eye-tracking system may include a controller to control the processing of the eye-tracking system.

The optical lens assembly may also be integrated with a wave guide, which may provide a virtual display that allows computer generated images to be viewed alongside real images by the user.

When the optical lens assemblies of the instant disclosure are integrated into an HMD, the HMD may be comfortable to wear for long periods of time due to the lighter weight, be aesthetically pleasing due to the ultra-thinness of the optical lens assembly, provide lower manufacturing costs, provide space for additional functional components, increase manufacturing yield, and provide an improved augmented-reality experience due to the obstruction-free field of view and wide aperture.

The deformable bounding element may deform, flex, and/or stretch in response to pressure from the deformable medium within an adjacent cavity. The deformable bounding element may be any element that, when deformed, changes at least one optical property of the optical lens assembly. For example, the deformable bounding element may be a flexible film. The optical properties may include accommodative properties, such as adjusting optical power, and/or adaptive properties, such as controlling, compensating, or correcting for wavefront errors, such as distortion and aberrations.

The deformable bounding element may have any of a variety of properties. For example, the deformable bounding element may be substantially optically clear. In some examples, as used herein, the term "substantially optically clear," as applied to an element, may refer to an element capable of transmitting an image through the element. In various examples, an element that is "substantially optically clear" may be capable of transmitting about 70% or more of incident light, about 80% or more of incident light, about 85% or more of visible light, or about 90% or more of incident light.

The deformable bounding element may include any of a variety of materials. For example, the deformable bounding element may include one or more flexible materials that may be shaped in response to one or more applied forces. In some examples, the deformable bounding element may include one or more tensioned or non-tensioned linear elastic and hyper-elastic polymers (examples are silicones and thermoplastic polyurethane (TPU), etc.). In various examples, the deformable bounding element may have a Young's modulus of less than about 50 gigapascals (GPa), less than about 10 GPa, less than about 2 GPa, or less than about 1 GPa.

The structural support element may function as a backing for an optical lens assembly when the deformable bounding element is bonded to the structural support element. For example, the structural support element may form a backing of a deformable medium cavity, a deformable bounding element and a deformable medium to the form the optical lens assembly. The structural support element may have any of a variety of properties. For example, the structural support element may be substantially optically clear.

The structural support element may include any of a variety of materials. For example, the structural support element may include glass, sapphire, acrylic, silica, ceramics, polycarbonates. In some examples, the structural support element may include optically clear, thin, and/or rigid substrates. In various examples, the structural support element may include flat or meniscus lens substrates. The structural support element may have a physical stress-strain curve that is linear or non-linear. The structural support element may have a rigidity sufficient to prevent the structural support element from substantially bending, deforming or changing shape during and/or after repeated cycles of deformation of the deformable bounding element due to pressure transmitted by the deformable medium within the cavity between the structural support element and the deformable bounding element.

In some examples, the composition of the structural support element material may be fairly uniform and may therefore provide a constant index of refraction throughout the material (e.g., in the range of 1.2 to 2.0). According to some examples, structural support element may be substantially flat, contributing no optical power to the optical lens assembly. In some examples, the structural support element may be shaped as a convex-concave or meniscus lens, in which one surface of the structural support element has a radius of curvature and the opposite side of the structural support element has a different radius of curvature. The difference in curvature between the two surfaces may thereby create a corrective power in the structural support element. The difference in curvature between the two surfaces may be constant, providing a constant optical power across the aperture of the structural support element, or the difference in the radius of curvature may be continuously variable across one or both of the surfaces (resulting in different optical powers being provided at different locations on the structural support element).

As described above, the deformable optical element may be filled with a deformable medium. The deformable medium may function as a medium that transfers pressure in a cavity to a deformable bounding element. The deformable medium may be substantially optically clear. In some examples, the deformable medium may have a viscosity range of about 0.001 to 1 Pascal-seconds, which may allow the deformable medium to flow through or past the components used during the process of filling the cavity with the deformable medium. In addition, the viscosity of the deformable medium may allow the deformable medium to flow within the cavity during adjustment of the deformable optical element focusing. The deformable medium may transmit the pressure applied by actuation of the optical lens assembly (e.g., by actuators on the perimeter of the optical lens assembly) to the deformable bounding element. The actuation may take any of a variety of forms, including, e.g., mechanical and/or electro-mechanical actuation.

The deformable medium may include any of a variety of materials. For example, the deformable medium may include water, glycerol, a gel, a polymer-gel, a foam, a polymer, silicone oil or a combination thereof. In various examples, pressure applied to the deformable medium may propagate through the deformable medium, affecting a change in curvature of the deformable medium as contained by the deformable bounding element. For example, the deformable medium in the cavity may have a near constant volume and may transmit the pressure as a hydraulic pressure and thus may be a non-compressible deformable medium. The viscosity of the deformable medium may allow the pressure to be transmitted quickly, resulting in low latency when adjusting the focal point. Alternatively, the deformable medium may be a gas, which may apply a pneumatic pressure to the deformable bounding element and thereby changes the curvature of the deformable bounding element (and, therefore, the focal point of the optical lens assembly). In some examples, the deformable medium may also include a liquid that extends the operating temperature range of the deformable optical element (e.g., ethylene glycol).

Figure 7:
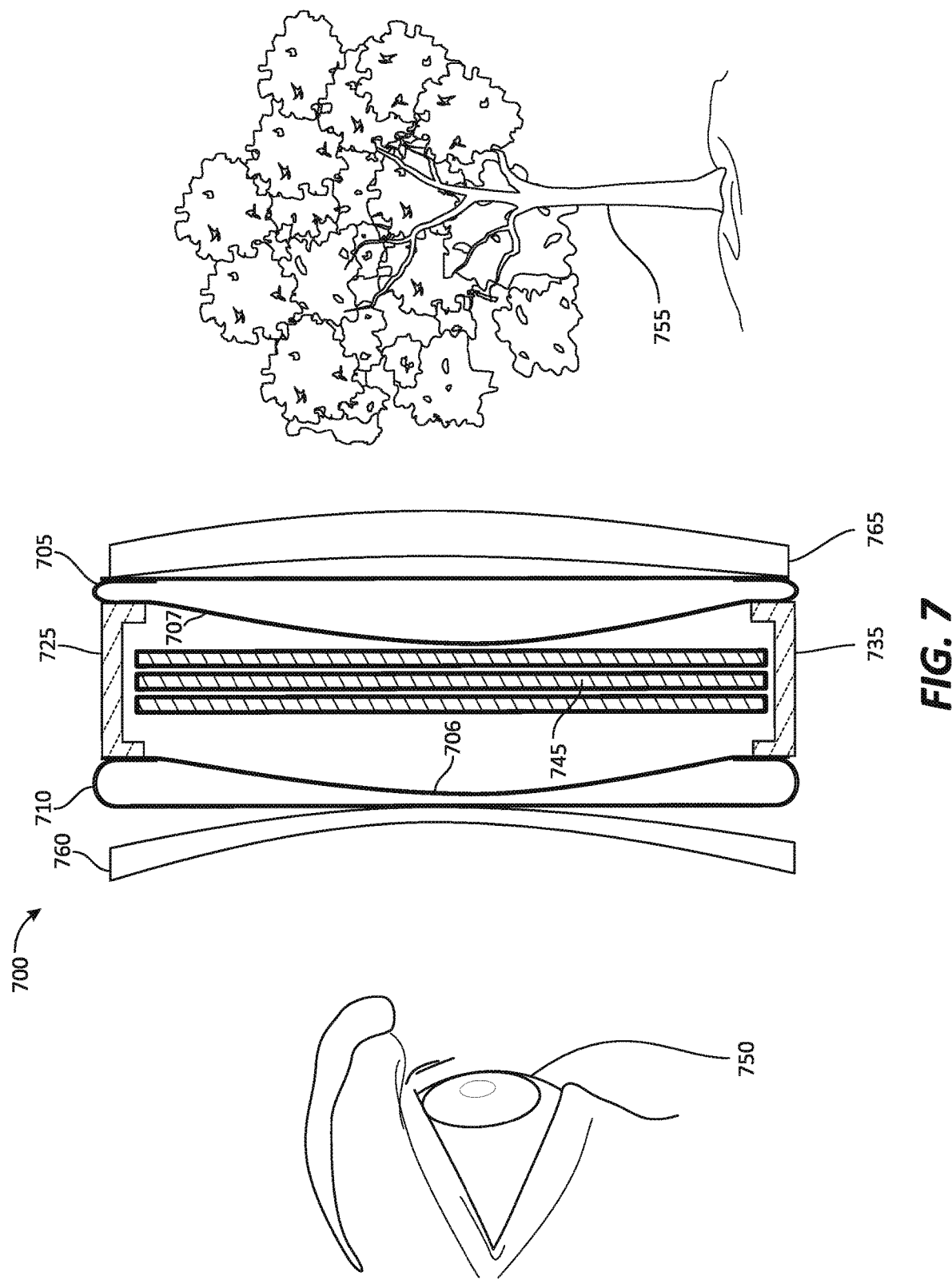
FIG. 7 is a side view of an adjustable optical lens assembly, a display assembly and an ophthalmic corrective element.

FIG. 7 provides an example of a side view of an adjustable optical lens assembly, a display element and an ophthalmic corrective element. As shown in FIG. 7, the optical lens apparatus 700 may include an RGB waveguide 745 which may function as a display, optical lens assemblies 705 and 710 and anti-reflective coatings 706 and 711. Optical lens assembly 710 may be positioned in front of RGB waveguide 745 and optical lens assembly 705 may be positioned behind RGB waveguide 745. Optical lens assembly 710 may be located nearest to eye 750 and may be actuated through carriages 725 and 735. Optical lens assembly 705 positioned behind RGB waveguide 745 may be simultaneously actuated through carriages 725 and 735 to adjust an optical property which may include creating a zero-power image of real world 755. Optical lens apparatus 700 may also include ophthalmic lenses 760 and 765 which may correct for the user's vision. Optical lens assemblies 705 and 710 may include anti-reflective coatings 706 and 707 respectively. Anti-reflective coatings 706 and 707 may include multiple layers of anti-reflective material on the surface of optical lens assemblies 705 and 710, which may reduce unwanted reflected light in optical lens apparatus 700.

Referring again to FIG. 7, optical lens apparatus 700 may modify the optical power provided for an image originating from RGB waveguide 745 disposed between optical lens assemblies 705 and 710 without modifying the optical power provided for an image originating beyond optical lens assemblies 705 and 710 (e.g., from a real-world object). In some examples, this may allow apparatuses and systems described herein to reduce, minimize, or eliminate accommodation-vergence conflict caused by augmented reality displays by modifying the apparent accommodation distance of images while minimizing any distortion to real-world images. Furthermore, in some examples, by using a single actuator to drive carriage elements 725 and 735 connecting optical lens assemblies 705 and 710, these apparatus and systems may reduce the amount of actuating force applied to deform optical lens assemblies 705 and 710. In addition, the use of a single adjustment mechanism may reduce the form factor, the cost of manufacture, and/or the potential points of failure of an optical lens assembly.

In some examples, carriages 725 and 735 may be driven by one or more actuators. For example, the actuator may include a mechanical and/or an electromechanical actuator. Examples of actuators that may drive carriages 725 and 735 may include, without limitation, a piezoelectric, an electroactive polymer, a piezo electric polymer, a dielectric elastomer, an electrostrictive polymer, a shape memory alloy, a voice coil, a pneumatic actuator, an electromagnetic motor (e.g., a servo motor, a stepper motor, a DC motor, etc.), a hydraulic actuator, or a combination thereof. The actuator may be augmented with secondary passive actuators such as cams, springs, etc. to efficiently drive carriages 725 and 735. The actuator may move carriages 725 and 735 in a radial direction which may be defined as normal to a major plane of the optical lens assembly, axially which may be defined as perpendicular to the radial direction, or a combination thereof. Each of the optical lens assemblies 705 and 710 in the HMD may be simultaneously actuated or individually actuated. In some examples, the actuator may be driven by a controller which measures the ambient and/or internal temperatures of the HMD and adjusts the speed of the actuators as a function of the ambient and/or internal temperatures.

Figure 8:
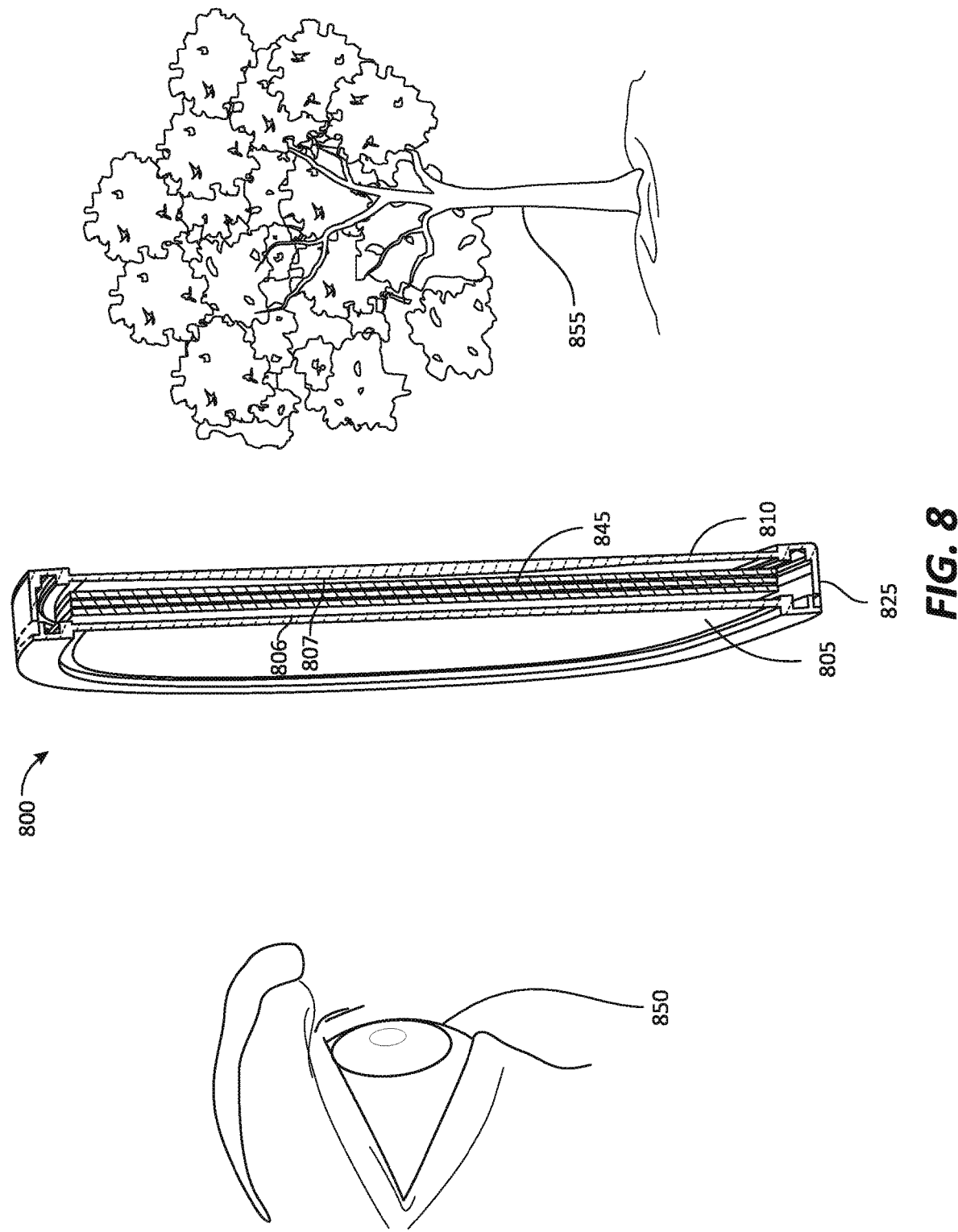
FIG. 8 is a side view of an optical lens assembly with a display mounted in a bezel.

FIG. 8 provides an example of a side view of an optical lens assembly and a display element mounted in a bezel. As shown in FIG. 8, bezel assembly 800 may include RGB waveguide 845, optical lens assemblies 805 and 810 mounted in bezel 825 and anti-reflective coatings 806 and 807. RGB waveguide 845 may function as a display. Optical lens assembly 810 may be positioned in front of RGB waveguide 845 and optical lens assembly 805 may be positioned behind RGB waveguide 845. Optical lens assembly 810 located nearest to eye 850 may be actuated by force distributors which may adjust an optical property which may include the focus of a virtual image created by RGB waveguide 845. The force actuators and components required for filling the optical lens assemblies 805 and 810 with the deformable medium may be located in a perimeter area of the bezel. In some examples, locating the force actuators and components required for filling optical lens assemblies 805 and 810 in the bezel area may contribute to the light weight and wide aperture of bezel assembly 800. Optical lens assemblies 805 and 810 may be simultaneously actuated by force distributors to create a zero-power image of the real world 855. Optical lens assemblies 805 and 810 may include anti-reflective coatings 806 and 807 respectively. Anti-reflective coatings 806 and 807 may include multiple layers of anti-reflective material on the surface of optical lens assemblies 805 and 810 which reduces unwanted reflected light in bezel assembly 800. Anti-reflective coatings 806 and 807 may be able to withstand repeated cycles of deformation.

Figure 9:
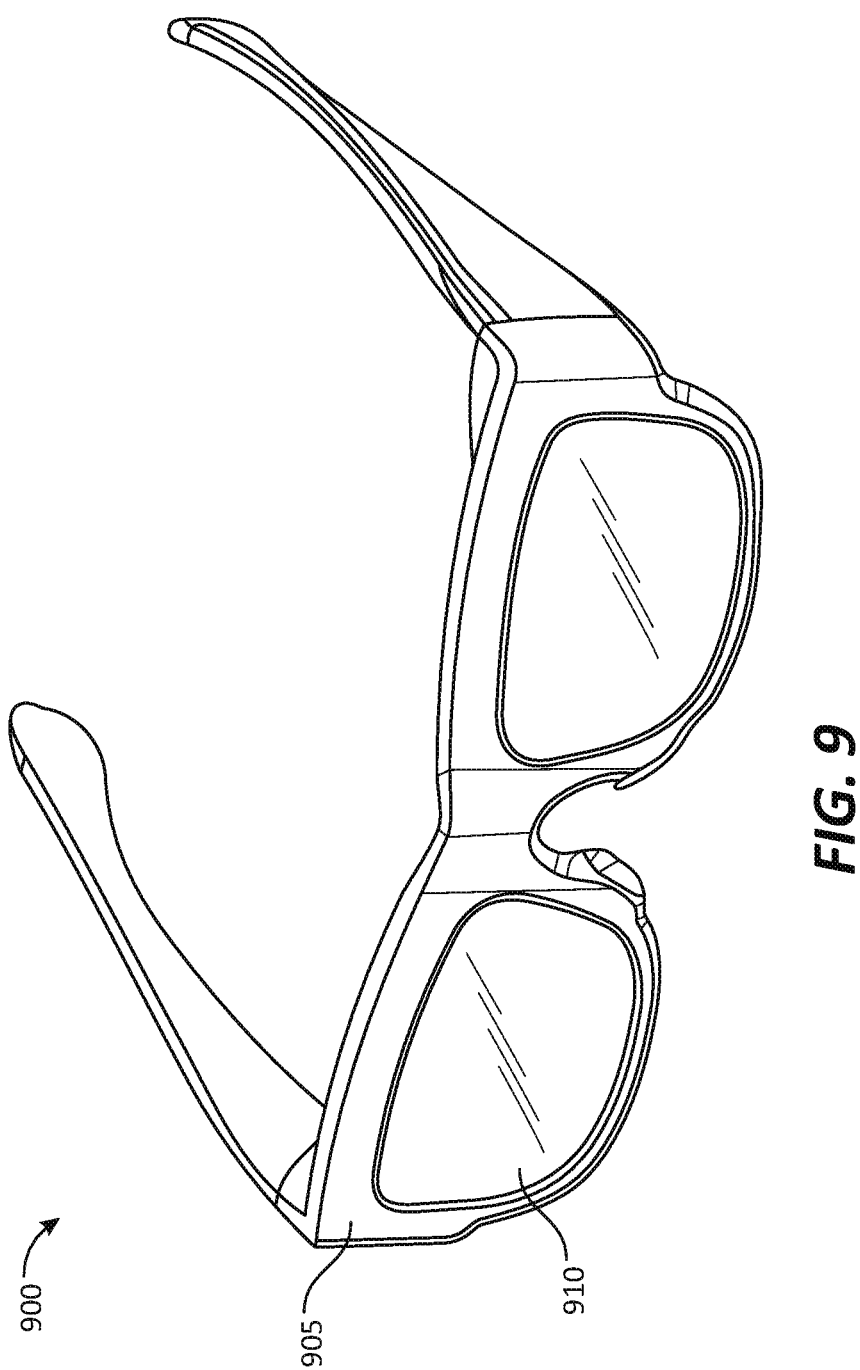
FIG. 9 is a perspective view of head-mounted device.

FIG. 9 provides an example of a perspective view of a head-mounted display system. As shown in FIG. 9 a head-mounted display system 900 may include optical lens assemblies 805 and/or 810, and waveguide assemblies 745 and/or 845 integrated into eye piece 910 and mounted within bezel 905. The optical lens assemblies 805 and/or 810 may include anti-reflective coatings. The anti-reflective coatings may reduce unwanted reflected light in eye piece 910.

Figure 10:
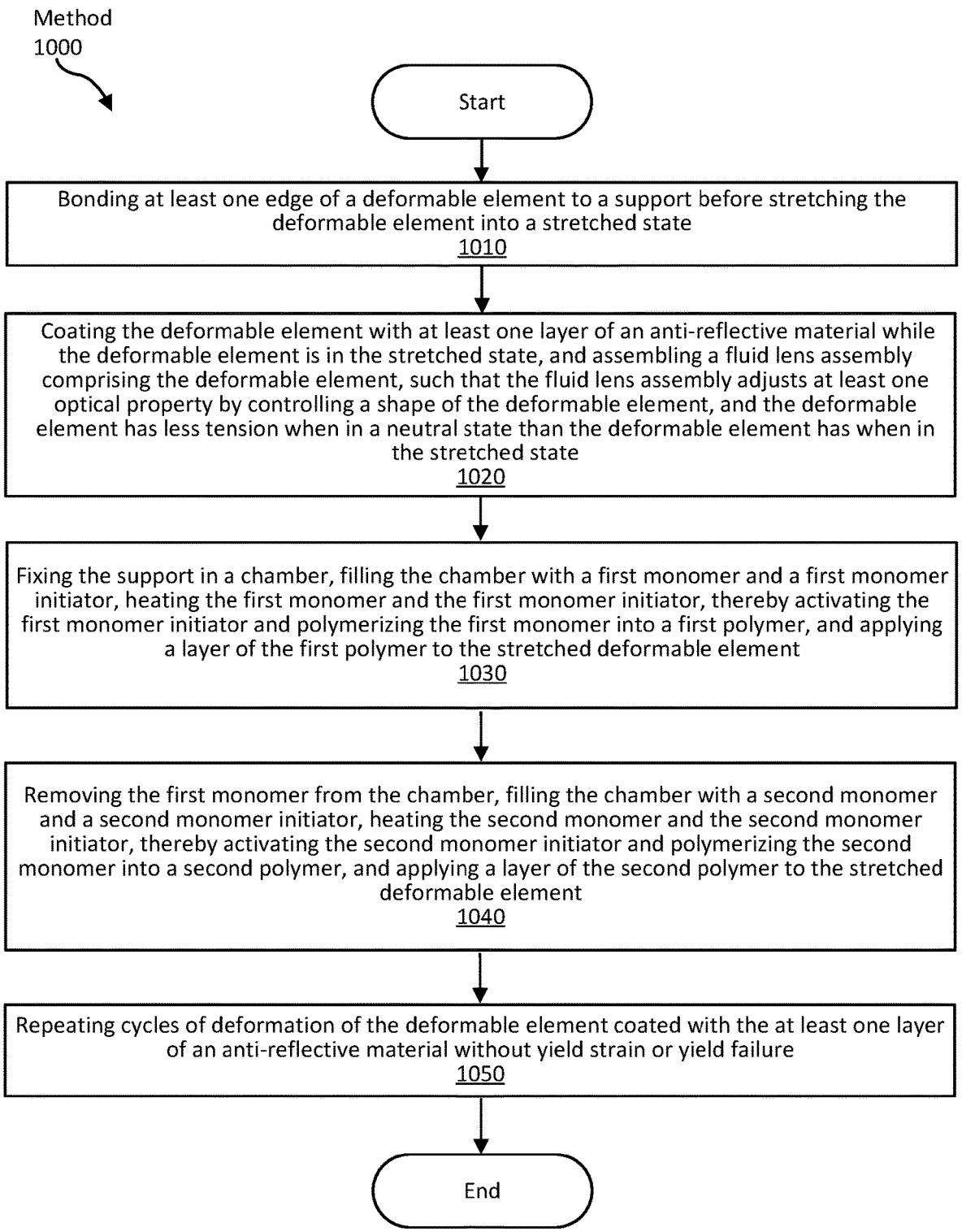
FIG. 10 shows a flow diagram of an example method of coating a stretched deformable bounding element using a chemical vapor deposition process.

FIG. 10 shows a flow diagram of an example method 1000 for coating a deformable bounding element with at least one layer of an anti-reflective material using an initiated chemical vapor deposition process while the deformable bounding element is stretched. As shown in FIG. 10, the method may include at step 1010, bonding at least one edge of a deformable bounding element to a support before stretching the deformable bounding element into a stretched state. At step 1020, the method may include coating the deformable bounding element with at least one layer of an anti-reflective material while the deformable bounding element is in the stretched state, and assembling an optical lens assembly comprising the deformable bounding element, such that the optical lens assembly adjusts at least one optical property by controlling a shape of the deformable bounding element, and the deformable bounding element has less tension when in a neutral state than the deformable bounding element has when in the stretched state. At step 1030, the method may include fixing the support in a chamber, filling the chamber with a first monomer and a first monomer initiator, heating the first monomer and the first monomer initiator, thereby activating the first monomer initiator and polymerizing the first monomer into a first polymer, and applying a layer of the first polymer to the stretched deformable bounding element. Additionally or alternatively, the first monomer initiator may be the first monomer. In this case, energy may be applied to the first monomer in order to cause the polymerization process of the first monomer itself. At step 1040, the method may include removing the first monomer from the chamber, filling the chamber with a second monomer and a second monomer initiator, heating the second monomer and the second monomer initiator, thereby activating the second monomer initiator and polymerizing the second monomer into a second polymer, and applying a layer of the second polymer to the stretched deformable bounding element. Additionally or alternatively, the second monomer initiator may be the second monomer. In this case, energy may be applied to the second monomer in order to cause the polymerization process of the second monomer itself. At step 1050, the method may include repeating cycles of deformation of the deformable bounding element coated with the one or more layers of anti-reflective material without yield strain or yield failure.

Figure 11:
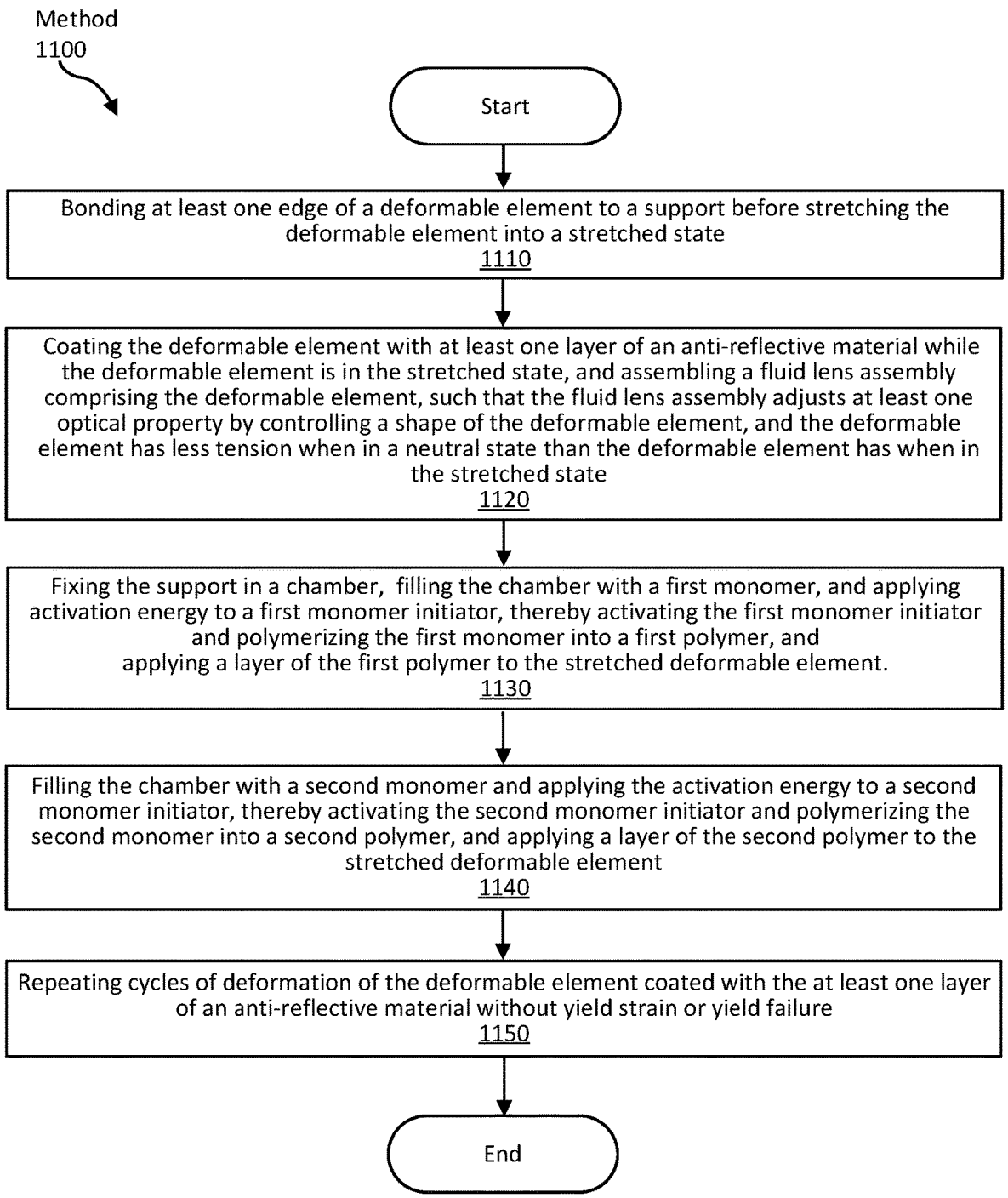
FIG. 11 shows a flow diagram of an example method of coating a stretched deformable bounding element using a thermal evaporation process.

FIG. 11 shows a flow diagram of an example method 1100 for coating a deformable bounding element with at least one layer of an anti-reflective material using thermal evaporation process while the deformable bounding element is stretched. As shown in FIG. 11, the method may include at step 1110, bonding at least one edge of a deformable bounding element to a support before stretching the deformable bounding element into a stretched state. At step 1120, the method may include coating the deformable bounding element with at least one layer of an anti-reflective material while the deformable bounding element is in the stretched state, and assembling an optical lens assembly comprising the deformable bounding element, such that the optical lens assembly adjusts at least one optical property by controlling a shape of the deformable bounding element, and the deformable bounding element has less tension when in a neutral state than the deformable bounding element has when in the stretched state. At step 1130, the method may include fixing the support in a chamber, filling the chamber with a first monomer, and applying activation energy to a first monomer initiator, thereby activating the first monomer initiator and polymerizing the first monomer into a first polymer, and applying a layer of the first polymer to the stretched deformable bounding element. The activation energy may include, without limitation, actinic radiation or thermal energy. In some examples, the thermal evaporation process may use the electrons of an electron beam to form free radicals in the first monomer itself. At step 1140, the method may include filling the chamber with a second monomer and applying the activation energy to a second monomer initiator, thereby activating the second monomer initiator and polymerizing the second monomer into a second polymer, and applying a layer of the second polymer to the stretched deformable bounding element. In some examples, the thermal evaporation process may use the electrons of an electron beam to form free radicals in the second monomer itself. At step 1150, the method may include repeating cycles of deformation of the deformable bounding element coated with the one or more layers of anti-reflective material without yield strain or yield failure.

Figure 12:
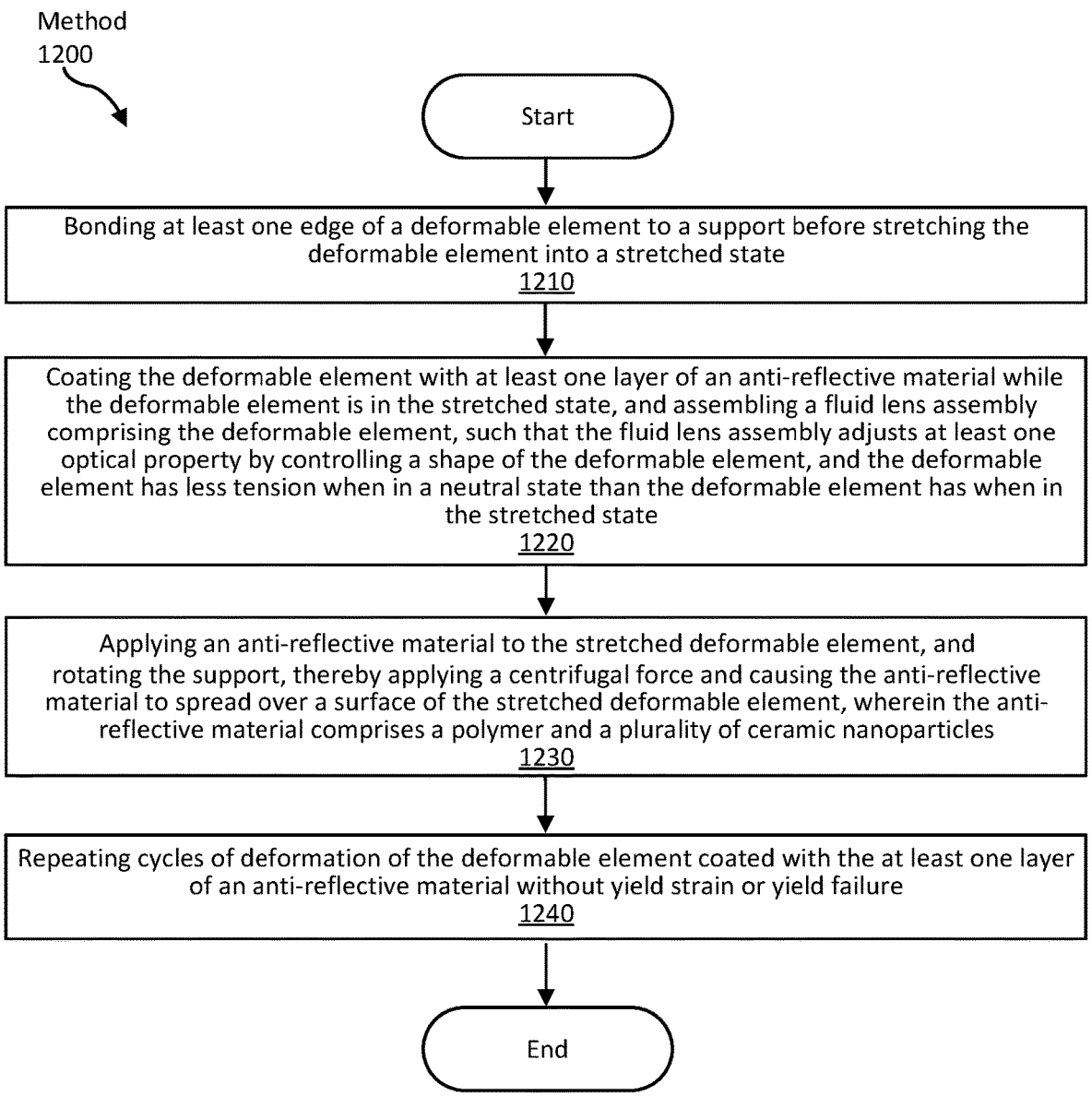
FIG. 12 shows a flow diagram of an example method of coating a stretched deformable bounding element using a spin coat process.

FIG. 12 shows a flow diagram of an example method 1200 for coating a deformable bounding element with at least one layer of an anti-reflective material using a spin coat process while the deformable bounding element is stretched. As shown in FIG. 12, the method may include at step 1210, bonding at least one edge of a deformable bounding element to a support before stretching the deformable bounding element into a stretched state. At step 1220, the method may include coating the deformable bounding element with at least one layer of an anti-reflective material while the deformable bounding element is in the stretched state, and assembling an optical lens assembly comprising the deformable bounding element, such that the optical lens assembly adjusts at least one optical property by controlling a shape of the deformable bounding element, and the deformable bounding element has less tension when in a neutral state than the deformable bounding element has when in the stretched state. At step 1230, the method may include applying an anti-reflective material to the stretched deformable bounding element, and rotating the support, thereby applying a centrifugal force and causing the anti-reflective material to spread over a surface of the stretched deformable bounding element, wherein the anti-reflective material comprises a polymer and a plurality of ceramic nanoparticles. At step 1240, the method may include repeating cycles of deformation of the deformable bounding element coated with the one or more layers of anti-reflective material without yield strain or yield failure.

Figure 13:
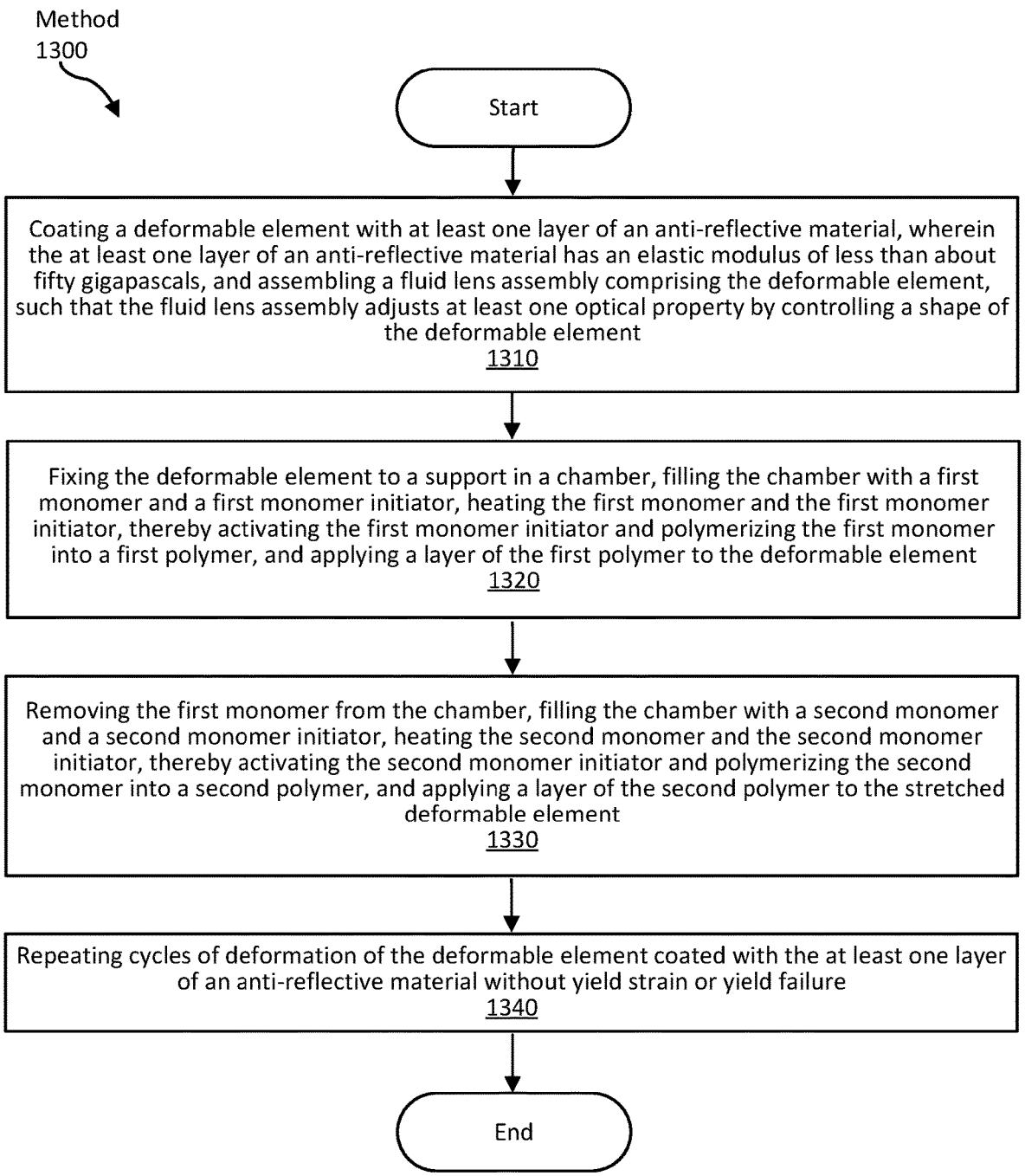
FIG. 13 shows a flow diagram of an example method of coating an unstretched deformable bounding element using a chemical vapor deposition process.

FIG. 13 shows a flow diagram of an example method 1300 for coating a deformable bounding element with at least one layer of an anti-reflective material using an initiated chemical vapor deposition process while the deformable bounding element is not stretched. As shown in FIG. 13, the method may include at step 1310, coating a deformable bounding element with at least one layer of an anti-reflective material, wherein the one or more layers of anti-reflective material has an elastic modulus of less than about fifty gigapascals, and assembling an optical lens assembly comprising the deformable bounding element, such that the optical lens assembly adjusts at least one optical property by controlling a shape of the deformable bounding element. At step 1320, the method may include fixing the deformable bounding element to a support in a chamber, filling the chamber with a first monomer and a first monomer initiator, heating the first monomer and the first monomer initiator, thereby activating the first monomer initiator and polymerizing the first monomer into a first polymer, and applying a layer of the first polymer to the deformable bounding element. Additionally or alternatively, the first monomer initiator may be the first monomer. In this case, energy may be applied to the first monomer in order to cause the polymerization process of the first monomer. At step 1330, the method may include removing the first monomer from the chamber, filling the chamber with a second monomer and a second monomer initiator, heating the second monomer and the second monomer initiator, thereby activating the second monomer initiator and polymerizing the second monomer into a second polymer, and applying a layer of the second polymer to the stretched deformable bounding element. Additionally or alternatively, the second monomer initiator may be the second monomer. In this case, energy may be applied to the second monomer in order to cause the polymerization process of the second monomer. At step 1340, the method may include repeating cycles of deformation of the deformable bounding element coated with the one or more layers of anti-reflective material without yield strain or yield failure.

Figure 14:
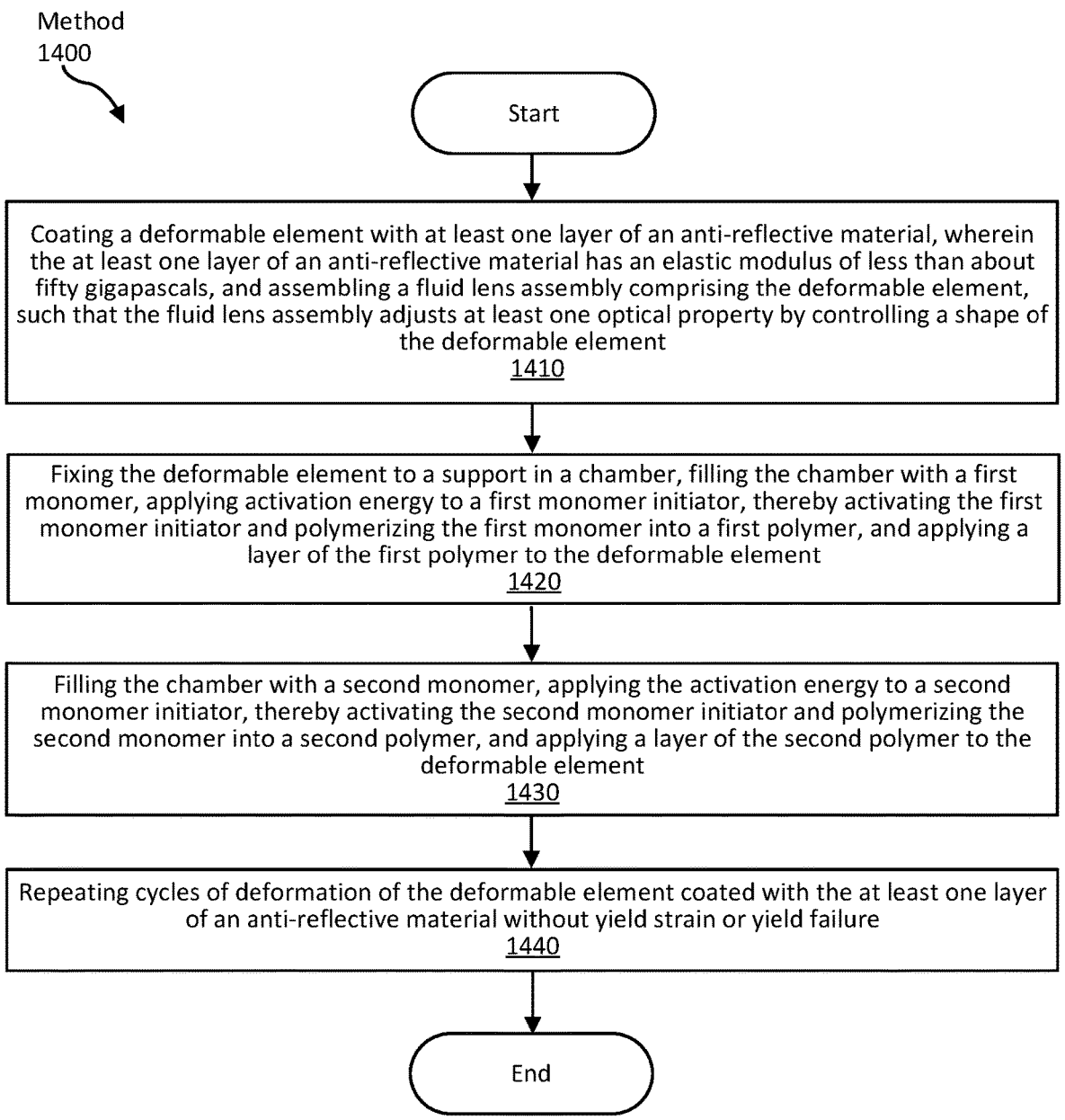
FIG. 14 shows a flow diagram of an example method of coating an unstretched deformable bounding element using a thermal evaporation process.

FIG. 14 shows a flow diagram of an example method 1400 for coating a deformable bounding element with at least one layer of an anti-reflective material using thermal evaporation process while the deformable bounding element is not stretched. As shown in FIG. 14, the method may include at step 1410, coating a deformable bounding element with at least one layer of an anti-reflective material, wherein the one or more layers of anti-reflective material has an elastic modulus of less than about fifty gigapascals, and assembling an optical lens assembly comprising the deformable bounding element, such that the optical lens assembly adjusts at least one optical property by controlling a shape of the deformable bounding element. At step 1420, the method may include fixing the deformable bounding element to a support in a chamber, filling the chamber with a first monomer, applying activation energy to a first monomer initiator, thereby activating the first monomer initiator and polymerizing the first monomer into a first polymer, and applying a layer of the first polymer to the deformable bounding element. The activation energy may include, without limitation, actinic radiation or thermal energy. At step 1430, the method may include filling the chamber with a second monomer, applying the activation energy to a second monomer initiator, thereby activating the second monomer initiator and polymerizing the second monomer into a second polymer, and applying a layer of the second polymer to the deformable bounding element. At step 1440, the method may include repeating cycles of deformation of the deformable bounding element coated with the one or more layers of anti-reflective material without yield strain or yield failure.

Figure 15:
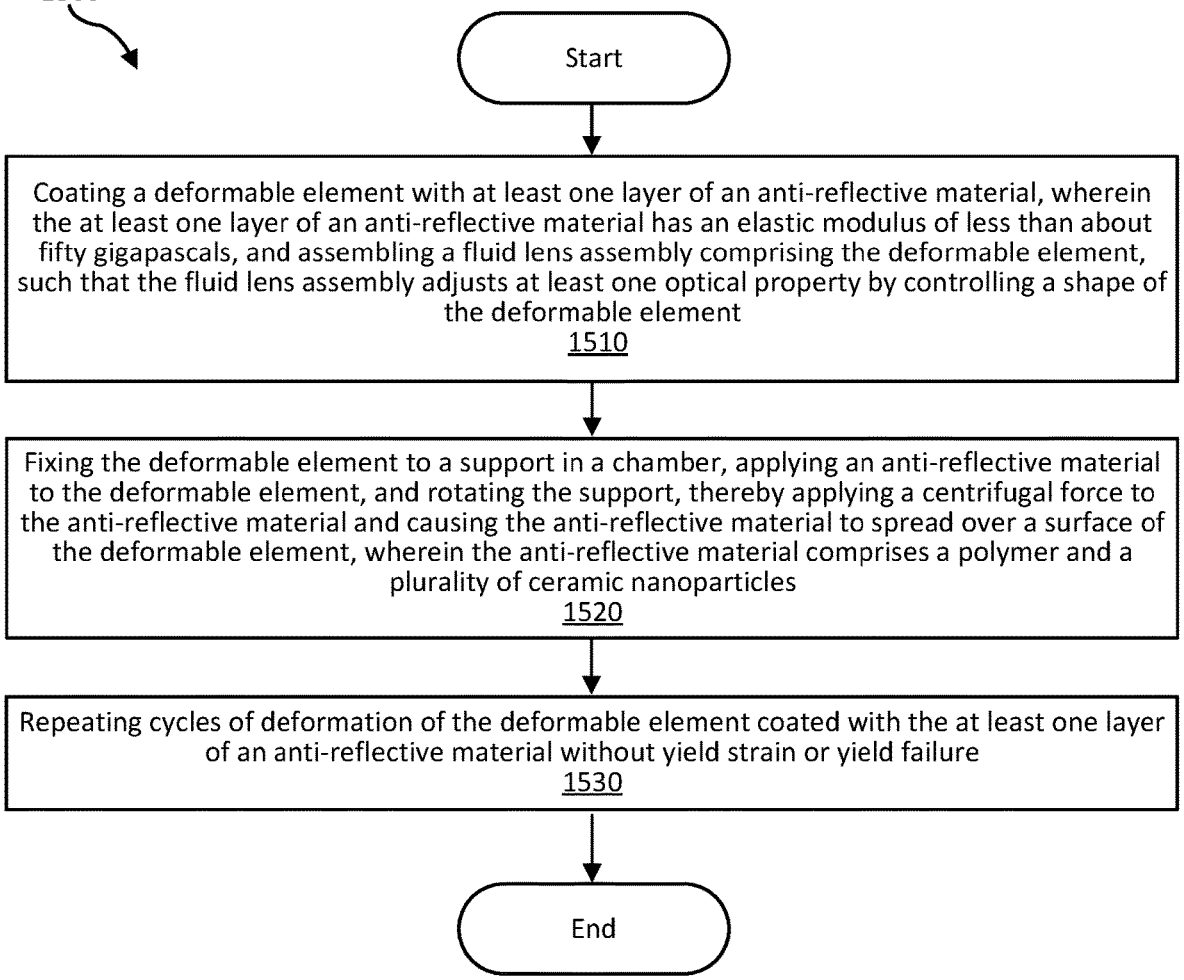
FIG. 15 shows a flow diagram of an example method of coating an unstretched deformable bounding element using a spin coat process.

FIG. 15 shows a flow diagram of an example method 1500 for coating a deformable bounding element with at least one layer of an anti-reflective material using a spin coat process while the deformable bounding element is not stretched. As shown in FIG. 14, the method may include at step 1510, coating a deformable bounding element with at least one layer of an anti-reflective material, wherein the one or more layers of anti-reflective material has an elastic modulus of less than about fifty gigapascals, and assembling an optical lens assembly comprising the deformable bounding element, such that the optical lens assembly adjusts at least one optical property by controlling a shape of the deformable bounding element. At step 1520, the method may include fixing the deformable bounding element to a support in a chamber, applying an anti-reflective material to the deformable bounding element, and rotating the support, thereby applying a centrifugal force to the anti-reflective material and causing the anti-reflective material to spread over a surface of the deformable bounding element, wherein the anti-reflective material comprises a polymer and a plurality of ceramic nanoparticles. At step 1530, the method may include repeating cycles of deformation of the deformable bounding element coated with the one or more layers of anti-reflective material without yield strain or yield failure.

As described above, coating optical devices such as deformable bounding elements with anti-reflective treatments may contribute to producing an optical lens assembly capable of providing anti-reflective properties while withstanding repeated deformations without degradation or failure. The anti-reflective treatment may be applied to stretched or unstretched deformable bounding elements using various methods which may include chemical vapor deposition, thermal evaporation and spin coating.

In some examples, when the optical lens assemblies of the instant disclosure are integrated into an HMD, the HMD may be comfortable to wear for long periods of time due to a reduction in reflected light, may provide a higher image quality, and may be aesthetically pleasing due to the ultra-thinness of the lenses. The optical lens assemblies may also provide lower manufacturing costs, have higher reliability and longevity, provide space for additional functional components, increase manufacturing yield, and provide an improved augmented-reality experience due to the reduction in reflected light, obstruction-free field of view and wide aperture.

Embodiments of the instant disclosure may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted device (HMD) connected to a host computer system, a standalone HMD, a mobile device or computing system, or any other hardware platform capable of providing artificial reality content to one or more viewers.

The process parameters and sequence of the steps described and/or illustrated herein are given by way of example only and may be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. A method comprising:
bonding at least one edge of a deformable bounding element to a rigid support substrate to form a cavity between the deformable bounding element and the rigid support substrate;
after bonding the at least one edge of the deformable bounding element to the rigid support substrate, stretching the deformable bounding element into a stretched state; and
coating the deformable bounding element with at least two layers of an anti-reflective material while the deformable bounding element is in the stretched state, comprising:
fixing the rigid support substrate in a chamber;
filling the chamber with a first monomer;
applying an activation energy to a first monomer initiator, thereby activating the first monomer initiator and polymerizing the first monomer into a first polymer;
applying a first layer of the first polymer to the deformable bounding element while the deformable bounding element is in the stretched state;
filling the chamber with a second monomer;
applying the activation energy to a second monomer initiator, thereby activating the second monomer initiator and polymerizing the second monomer into a second polymer; and
after applying the first layer of the first polymer to the deformable bounding element, applying a second layer of the second polymer to the first layer of the first polymer over the deformable bounding element while the deformable bounding element is in the stretched state.

2. The method of claim 1, wherein applying the activation energy to the first monomer initiator comprises:
heating the first monomer and the first monomer initiator.

3. The method of claim 2, wherein applying the activation energy to the second monomer initiator comprises:
heating the second monomer and the second monomer initiator.

4. The method of claim 1, wherein the activation energy is applied by at least one of a heat source, an x-ray source, an electron beam, an ultraviolet light source, or a visible light source.

5. The method of claim 1, wherein coating the deformable bounding element with the at least two layers of the anti-reflective material while the deformable bounding element is in the stretched state comprises:
rotating the rigid support substrate, thereby applying a centrifugal force to the two layers of the anti-reflective material and causing the two layers of the anti-reflective material to spread over a surface of the deformable bounding element in the stretched state, wherein the two layers of the anti-reflective material comprises the first polymer and the second polymer and a plurality of ceramic nanoparticles.

6. The method of claim 1, wherein the deformable bounding element is stretched over the rigid support substrate by at least ten percent.

7. The method of claim 1, wherein the at least two layers of the anti-reflective material comprises a first anti-reflective layer and a second, adjacent anti-reflective layer, wherein a first refractive index of the first anti-reflective layer differs from a second refractive index of the second, adjacent anti-reflective layer by at least 0.05.

8. The method of claim 1, wherein the at least two layers of the anti-reflective material are configured to withstand repeated cycles of deformation of up to two percent engineering strain without yield strain or yield failure.

9. The method of claim 1, wherein an average reflectivity of the at least two layers of the anti-reflective material for frequencies of light between four hundred nanometers and six hundred and fifty nanometers which enters a surface of the at least two layers of the anti-reflective material at an angle of incidence normal to a major plane of the surface of the at least two layers of the anti-reflective material is less than two percent.

10. The method of claim 1, wherein the at least two layers of the anti-reflective material has an elastic modulus of less than fifty gigapascals.

11. The method of claim 1, wherein the at least two layers of the anti-reflective material are non-porous.

12. The method of claim 1, further comprising:
assembling an optical lens assembly comprising the deformable bounding element, such that:
the optical lens assembly adjusts at least one optical property by controlling a shape of the deformable bounding element; and
the deformable bounding element has less tension when in a neutral state than the deformable bounding element has when in the stretched state.

13. The method of claim 1, wherein the at least two layers of the anti-reflective material have a reflection haze of less than one percent for five hundred and fifty nanometer collimated light outside a two-degree cone; and
a longitudinal axis of the two-degree cone is normal to a major plane of a surface of the at least two layers of the anti-reflective material.

14. The method of claim 1, wherein the rigid support substrate comprises an optical lens.

15. The method of claim 14, wherein the optical lens has a curvature such that the optical lens exhibits an optical power.

16. The method of claim 1, wherein the rigid support substrate is optically clear.

17. The method of claim 1, wherein the rigid support substrate comprises at least one of: glass, sapphire, acrylic, silica, a ceramic, or a polycarbonate.

18. The method of claim 1, further comprising filling the cavity between the deformable bounding element and the rigid support substrate with a deformable medium.

19. The method of claim 18, wherein the deformable medium comprises a fluid.

20. The method of claim 18, wherein the deformable medium comprises at least one of: water, glycerol, a gel, a polymer-gel, a foam, a polymer, or silicone oil.

21. The method of claim 18, wherein the deformable medium is substantially optically clear.

22. A method comprising:

bonding at least one edge of a deformable bounding element to a support;

after bonding the at least one edge of the deformable bounding element to the support, stretching the deformable bounding element into a stretched state; and coating the deformable bounding element with at least one layer of an anti-reflective material while the deformable bounding element is in the stretched state, comprising:

fixing the support in a chamber;

filling the chamber with a first monomer and a first monomer initiator;

heating the first monomer and the first monomer initiator, thereby activating the first monomer initiator and polymerizing the first monomer into a first polymer;

applying a layer of the first polymer to the deformable bounding element in the stretched state;

removing the first monomer from the chamber;

filling the chamber with a second monomer and a second monomer initiator;

heating the second monomer and the second monomer initiator, thereby activating the second monomer initiator and polymerizing the second monomer into a second polymer; and applying a layer of the second polymer to the deformable bounding element in the stretched state.

23. A method comprising:

bonding at least one edge of a deformable bounding element to a support;

after bonding the at least one edge of the deformable bounding element to the support, stretching the deformable bounding element into a stretched state; and coating the deformable bounding element with at least one layer of an anti-reflective material while the deformable bounding element is in the stretched state, comprising:

fixing the support in a chamber;

filling the chamber with a first monomer;

applying activation energy to a first monomer initiator, thereby activating the first monomer initiator and polymerizing the first monomer into a first polymer;

applying a layer of the first polymer to the deformable bounding element in the stretched state;

filling the chamber with a second monomer;

applying the activation energy to a second monomer initiator, thereby activating the second monomer initiator and polymerizing the second monomer into a second polymer; and applying a layer of the second polymer to the deformable bounding element in the stretched state.

* * * * *